(12) United States Patent
Iizuka

(10) Patent No.: US 8,994,134 B2
(45) Date of Patent: Mar. 31, 2015

(54) ELECTRONIC DEVICE AND METHOD OF MANUFACTURING THE SAME

(71) Applicant: Shinko Electric Industries Co., Ltd., Nagano-shi, Nagano (JP)

(72) Inventor: Hajime Iizuka, Nagano (JP)

(73) Assignee: Shinko Electric Industires Co., Ltd., Nagano-shi (JP)

( * ) Notice: Subject to any disclaimer, the term of this patent is extended or adjusted under 35 U.S.C. 154(b) by 36 days.

(21) Appl. No.: 13/719,843

(22) Filed: Dec. 19, 2012

(65) Prior Publication Data

US 2013/0161776 A1 Jun. 27, 2013

(30) Foreign Application Priority Data

Dec. 22, 2011 (JP) .................................. 2011-280907

(51) Int. Cl.
| | |
|---|---|
| H01L 31/0203 | (2014.01) |
| H01L 31/18 | (2006.01) |
| H01L 25/16 | (2006.01) |
| H01L 23/498 | (2006.01) |
| H01L 21/56 | (2006.01) |
| H01L 27/146 | (2006.01) |
| H01L 23/00 | (2006.01) |
| H01L 23/13 | (2006.01) |

(52) U.S. Cl.
CPC ............ *H01L 31/0203* (2013.01); *H01L 31/18* (2013.01); *H01L 25/16* (2013.01); *H01L 23/49822* (2013.01); *H01L 23/49833* (2013.01); *H01L 21/563* (2013.01); *H01L 27/14618* (2013.01); *H01L 2224/73204* (2013.01); *H01L 23/49811* (2013.01); *H01L 24/16* (2013.01); *H01L 2224/13144* (2013.01); *H01L 2224/16227* (2013.01); *H01L 23/13* (2013.01); *H01L 2224/16237* (2013.01); *H01L 2224/16225* (2013.01)
USPC ........................................................ 257/433

(58) Field of Classification Search
None
See application file for complete search history.

(56) References Cited

U.S. PATENT DOCUMENTS

| 7,989,707 | B2 | 8/2011 | Yamano | |
|---|---|---|---|---|
| 2009/0065242 | A1* | 3/2009 | Sato | ................. 174/255 |
| 2011/0156264 | A1* | 6/2011 | Machida | ........................ 257/773 |
| 2011/0256662 | A1 | 10/2011 | Yamano | |

FOREIGN PATENT DOCUMENTS

WO    WO 2007/069606 A1    6/2007

\* cited by examiner

*Primary Examiner* — Fernando L Toledo
*Assistant Examiner* — Valerie N Newton
(74) *Attorney, Agent, or Firm* — Kratz, Quintos & Hanson, LLP

(57) ABSTRACT

An electronic device includes a first wiring substrate including a component mounting area, a second wiring substrate stacked on the first wiring substrate, in which an opening portion is provided in a part corresponding to the component mounting area, and connected to the first wiring substrate via solder bumps which are arranged on a periphery of the component mounting area, a frame-like resin dam layer formed between the solder bumps on the periphery of the component mounting area, and surrounding the component mounting area, and an electronic component mounted on the component mounting area of the first wiring substrate, wherein a sealing resin is filled between the first wiring substrate and the second wiring substrate such that the component mounting area is formed as a resin non-forming area by the resin dam layer.

5 Claims, 22 Drawing Sheets

ELECTRONIC DEVICE AND METHOD OF MANUFACTURING THE SAME

CROSS-REFERENCE TO RELATED APPLICATIONS

This application is based upon and claims the benefit of priority of the prior Japanese Patent Application No. 2011-280907, filed on Dec. 22, 2011, the entire contents of which are incorporated herein by reference.

FIELD

It is related to an electronic device, and a method of manufacturing the same.

BACKGROUND

In the prior art, there is the electronic component built-in package in which a semiconductor chip is mounted between stacked wiring substrates in a state that the semiconductor chip is buried in a sealing resin. In such electronic component built-in package, the semiconductor chip is mounted on a lower wiring substrate, and then solder bumps of an upper wiring substrate are connected to the lower wiring substrate such that the semiconductor chip is housed between them.

Subsequently, a sealing resin is filled in a space between the lower wiring substrate and the upper wiring substrate, and thus the semiconductor chip is sealed with the sealing resin.

In this electronic component built-in package, the sealing resin is filled in the linked space between the lower wiring substrate and the upper wiring substrate. Therefore, the sealing resin is formed in the whole area on the lower wiring substrate. As a result, it cannot be simply implemented to form an exposed area on which the sealing resin is not formed on a part of the lower wiring substrate.

A related art is disclosed in International Publication Pamphlet No. WO2007-069606.

SUMMARY

According to one aspect discussed herein, there is provided an electronic device, which includes a first wiring substrate including a component mounting area, a second wiring substrate stacked on the first wiring substrate, in which an opening portion is provided in a part corresponding to the component mounting area, and connected to the first wiring substrate via solder bumps which are arranged on a periphery of the component mounting area, a frame-like resin dam layer formed between the solder bumps on the periphery of the component mounting area, and surrounding the component mounting area, and an electronic component mounted on the component mounting area of the first wiring substrate, wherein a sealing resin is filled between the first wiring substrate and the second wiring substrate such that the component mounting area is formed as a resin non-forming area by the resin dam layer.

Also, according to another aspect discussed herein, there is provided a method of manufacturing an electronic device, which includes preparing a first wiring substrate including a component mounting area, and a second wiring substrate in which an opening portion is provided in a part corresponding to the component mounting area, and including solder bumps arranged in a part corresponding to a periphery of the component mounting area, adhering a fluxing function containing resin onto the solder bumps of the second wiring substrate, then arranging the solder bumps of the second wiring substrate on the first wiring substrate, and then applying a reflow heating, connecting the solder bumps of the second wiring substrate to the first wiring substrate, and obtaining frame-like resin dam layer formed between the solder bumps on the periphery of the component mounting area, from the fluxing function containing resin, by the reflow heating, and filling a sealing resin between the first wiring substrate and the second wiring substrate, wherein the sealing resin is blocked by the resin dam layer, and the component mounting area is formed as a resin non-forming area, and in a predetermined step, an electronic component is mounted on the component mounting area of the first wiring substrate.

The object and advantages of the invention will be realized and attained by means of the elements and combination particularly pointed out in the claims.

It is to be understood that both the foreign general description and the following detailed description are exemplary and explanatory and are not restrictive of the invention, as claimed.

DESCRIPTION OF EMBODIMENTS

Embodiments of the present invention will be explained with reference to the accompanying drawings hereinafter.

(First Embodiment)

Figure 11:
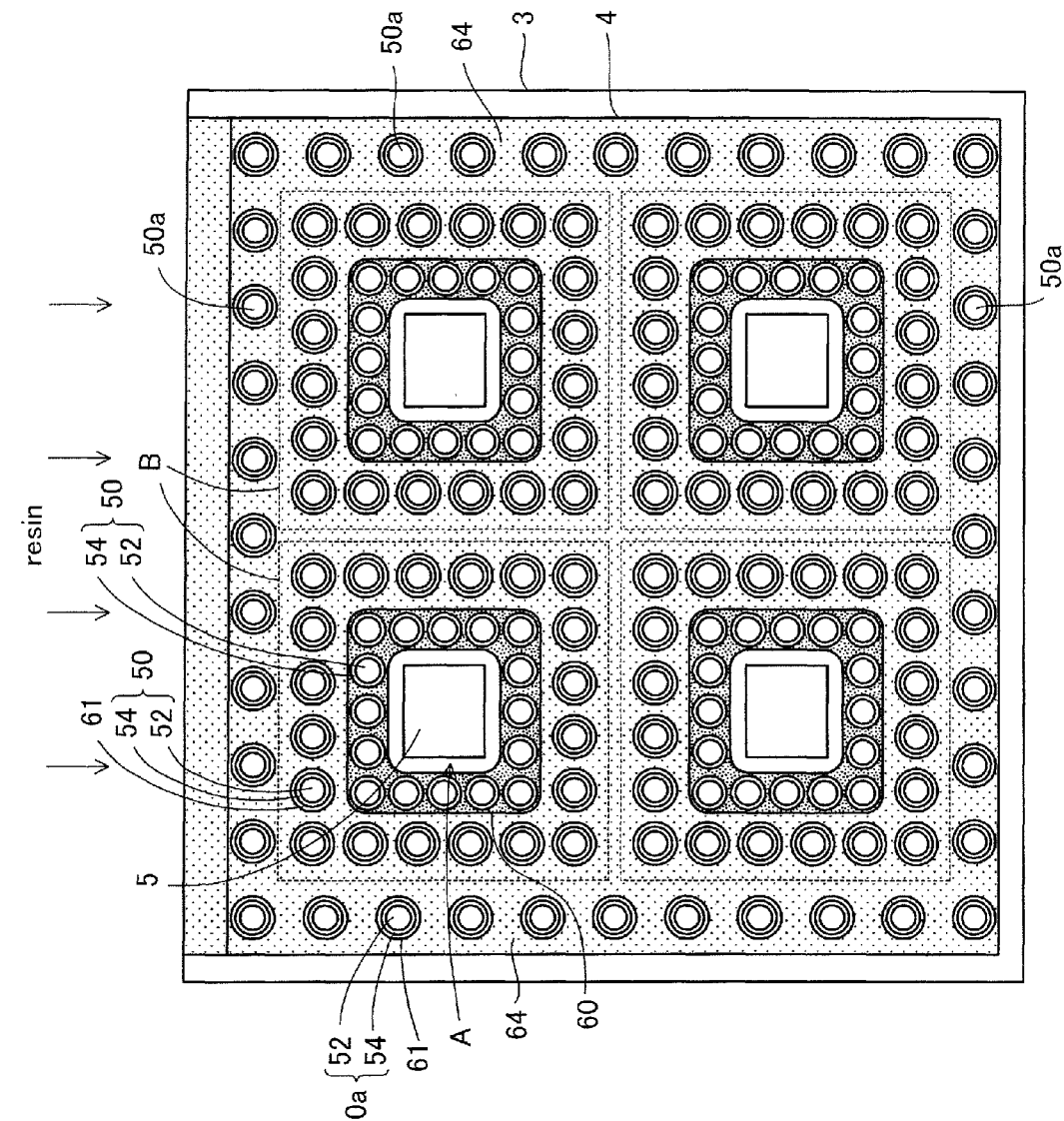
FIG. 11 is a plan view (#10) depicting the method of manufacturing the electronic device according to the first embodiment.
Figure 12:
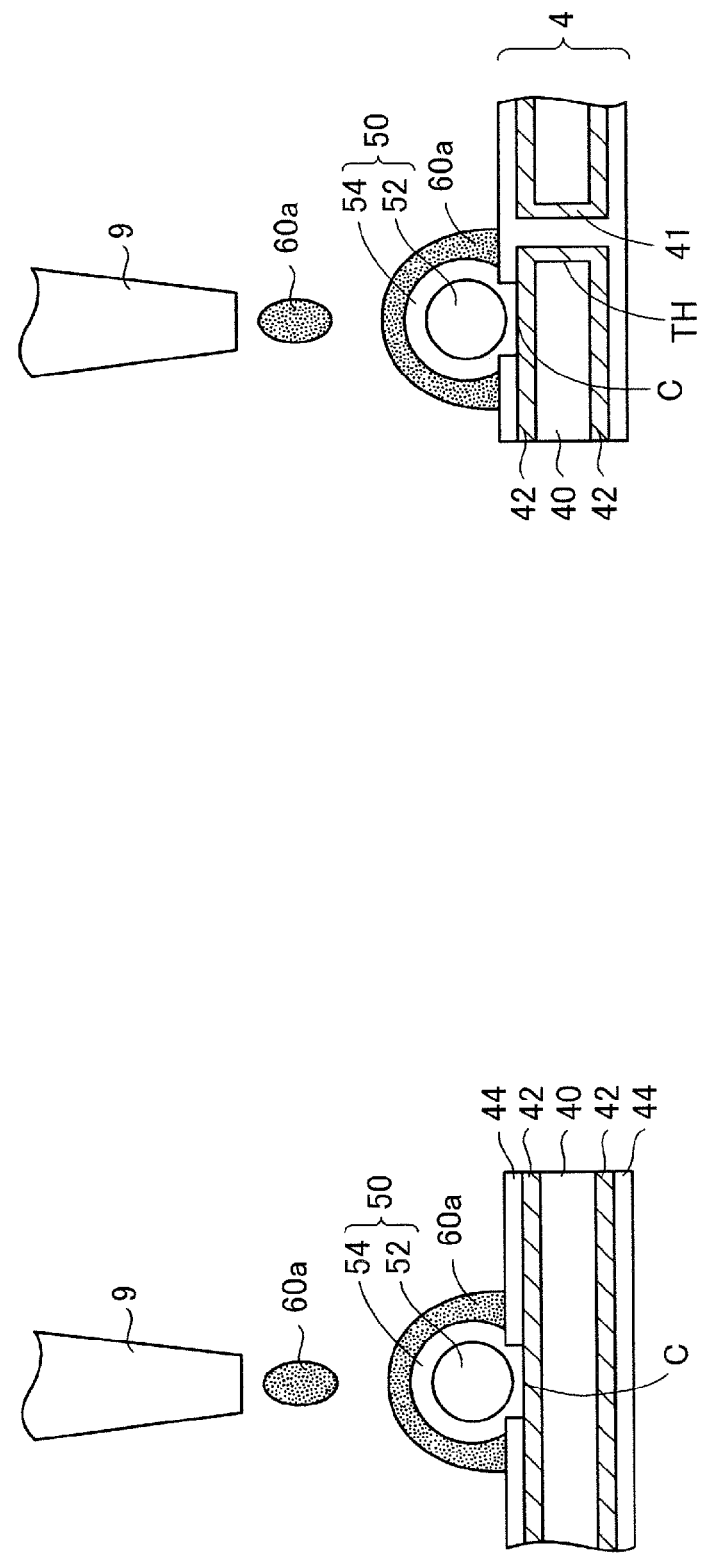
FIG. 12 is sectional views (#11) depicting the method of manufacturing the electronic device according to the first embodiment.
Figure 13:
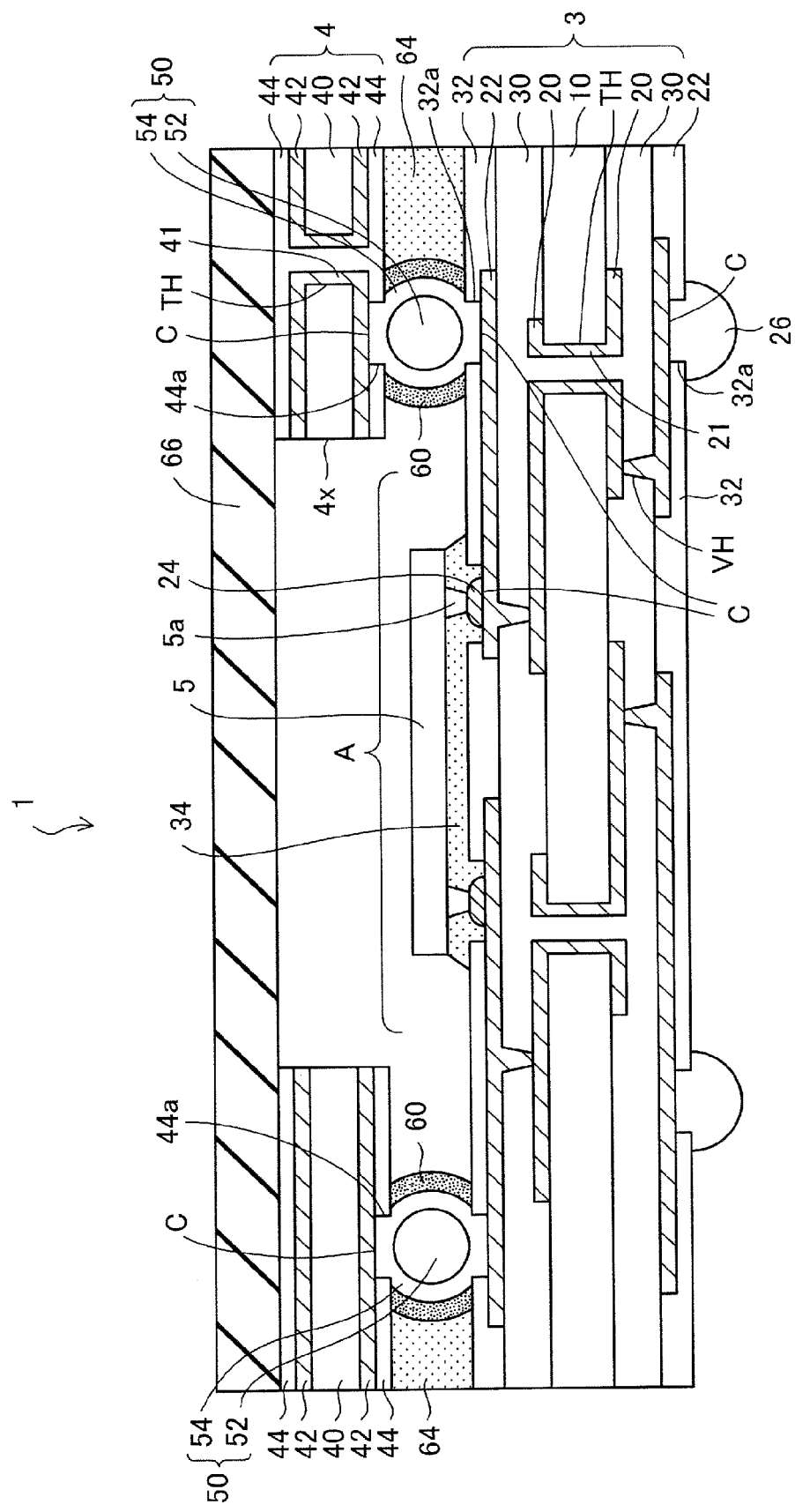
FIG. 13 is a sectional view depicting an electronic device according to the first embodiment.

FIG. 1 to FIG. 12 are views depicting a method of manufacturing an electronic device according to a first embodiment, and FIG. 13 is a view depicting an electronic device according to the first embodiment.

Figure 1:
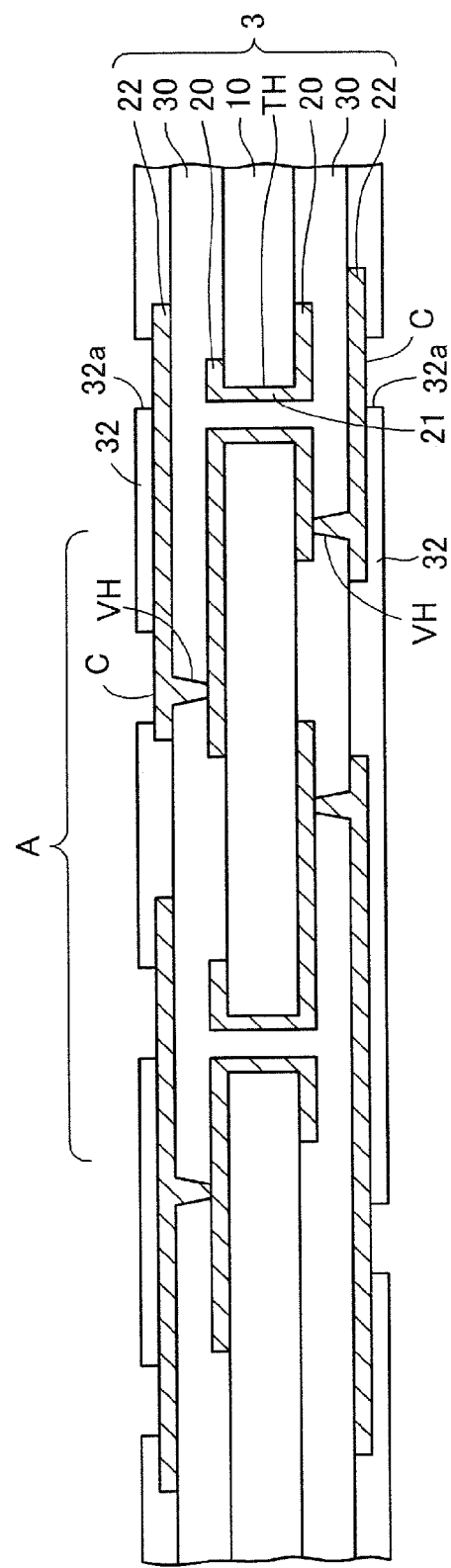
FIG. 1 is a sectional view (#1) depicting a method of manufacturing an electronic device according to a first embodiment.

In the method of manufacturing the electronic device according to the first embodiment, as depicted in FIG. 1, first, a first wiring substrate 3 is prepared. In the first wiring substrate 3, through holes TH are formed in a core substrate 10 to penetrate it in the thickness direction. This core substrate 10 is formed of insulating material such as a glass epoxy resin, or the like.

A first wiring layer 20 made of copper, or the like is formed on both surface sides of the core substrate 10. The first wiring layers 20 on both surface sides are connected mutually via a through hole plating layer 21 formed in the through hole TH. Each of the through hole plating layers 21 is formed on the sidewall so as to leave a hole in the through holes TH. Also, an interlayer insulating layer 30 made of a resin, or the like is formed on both surface sides of the core substrate 10 respectively.

Instead of the through hole plating layers 21, penetration electrodes each of which is filled in the whole space of the through hole TH may be formed. Thus, the first wiring layers 20 on both surface sides may be connected mutually via the penetration electrode.

Also, via holes VH each reaching the first wiring layer 20 are formed in the interlayer insulating layer 30 on both surface sides respectively. Second wiring layers 22 each connected to the first wiring layer 20 through the via hole VH (via conductor) are formed on the interlayer insulating layer 30 on both surface sides respectively.

Further, a solder resist 32 in which an opening portion 32a is provided on connection portions C of the second wiring layers 22, is formed on both surface sides of the core substrate 10 respectively. A component mounting area A in which an electronic component is mounted is demarcated on an upper surface of the first wiring substrate 3.

Figure 2:
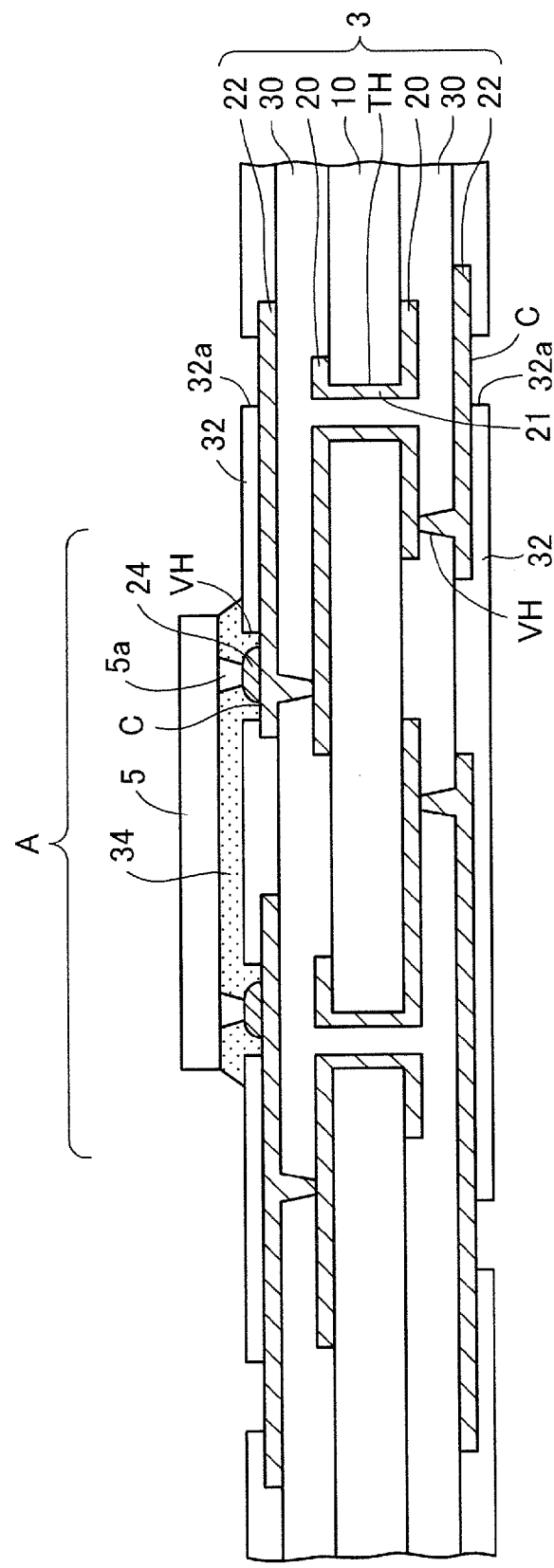
FIG. 2 is a sectional view (#2) depicting the method of manufacturing the electronic device according to the first embodiment.

Then, as depicted in FIG. 2, an imaging element 5 having gold bumps 5a is prepared as the electronic component. Then, the gold bumps 5a of the imaging element 5 are connected to the connection portions C of the second wiring layers 22 of the first wiring substrate 3 via a solder layer 24.

Then, an underfill resin 34 is filled in a clearance between the imaging element 5 and the first wiring substrate 3. As the imaging element 5, a semiconductor image sensor of CCD type, CMOS type, or the like is used. In this manner, the imaging element 5 is mounted in the component mounting area A of the first wiring substrate 3.

Figure 3:
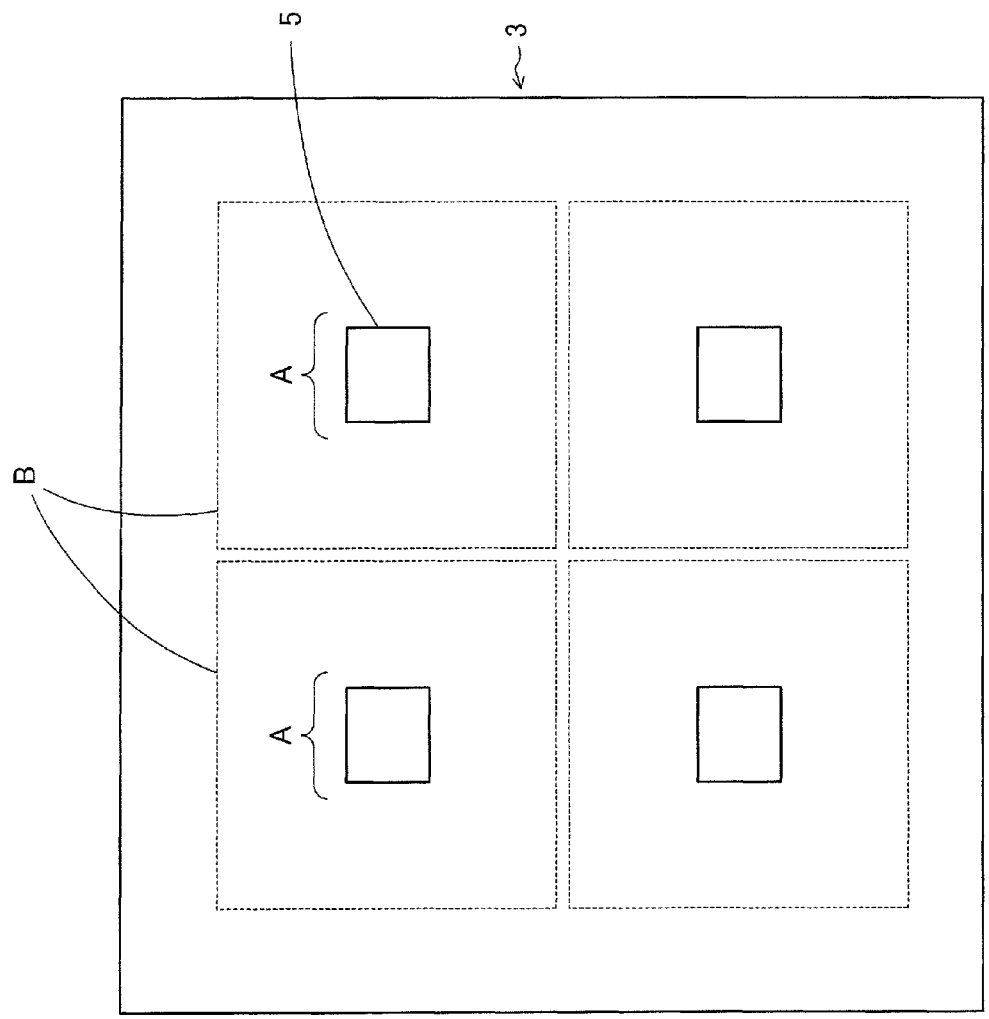
FIG. 3 is a plan view (#3) depicting the method of manufacturing the electronic device according to the first embodiment.

When the state in FIG. 2 is viewed from the top, as depicted in a plan view of FIG. 3, the first wiring substrate 3 serves as a multi-production substrate. By way of example, four package areas B are demarcated on the first wiring substrate 3, and the imaging element 5 is mounted in the component mounting areas A of the package areas B respectively.

Then, as depicted in FIG. 4A, a second wiring substrate 4 is prepared. In the second wiring substrate 4, the through hole TH is formed in a core substrate 40 so as to penetrate it in the thickness direction. Then, wiring layers 42 connected mutually via a through hole plating layer 41 which is formed on the sidewall of the through hole TH, are formed on both surface sides of the core substrate 40 respectively.

Then, a solder resist 44 is formed on both surface sides of the core substrate 40 respectively. In the solder resists 44 on the lower surface side of the core substrate 40, an opening portion 44a is provided on the connection portions C of the wiring layer 42.

Also, in the second wiring substrate 4, an opening portion 4x is provided in the area that corresponds to the component mounting area A of the first wiring substrate 3.

Then, a solder containing conductive ball 50 is mounted on the connection portions C of the wiring layer 42 on the lower surface side of the second wiring substrate 4. The solder containing conductive ball 50 is a preferable example of the solder bump.

The solder containing conductive ball 50 illustrated in FIG. 4A is a metal core solder ball which is formed of a metal core ball 52 made of copper, or the like, and a solder layer 54 covering its outer surface.

The solder containing conductive balls 50 of the second wiring substrate 4 in the area depicted in FIG. 4A are arranged to correspond to the connection portions C of the second wiring layers 22, which are arranged in the frame-like areas on the periphery of the component mounting area A of the first wiring substrate 3.

A diameter of the solder containing conductive balls 50 is about 150 μm to 300 μm, for example. As the solder layer 54, preferably a lead-free solder such as a tin-silver based solder, a tin-silver-copper based solder, or the like is used.

Here, as the solder containing conductive balls 50, a resin core solder ball which is formed of a resin core ball and a solder layer covering its outer surface, may be used.

Otherwise, instead of the solder containing conductive balls 50, a solder ball the whole of which is formed of solder may be used.

From such a viewpoint that a desired interval is ensured with good precision when the first wiring substrate 3 and the second wiring substrate 4 are stacked, it is preferable that the metal core solder ball or the resin core solder ball, which does not soften at the time of reflow heating, is used.

Further, as depicted in FIG. 4B, instead of the solder containing conductive balls 50, a metal post 51 shaped like a circular cylinder or a polygonal column, which is formed of a metal plating layer 56 made of copper, or the like, and a solder plating layer 58 formed thereon, may be used.

In this manner, as an example of the solder bump mounted on the second wiring substrate 4, there are the solder containing conductive ball 50, the solder ball the whole of which is formed of solder, or the metal post that at least a part in the locations that are connected to the first wiring substrate 3 is covered with a solder layer, and the like. In this event, the solder bump may have the structure that the solder may be formed on the connection portion at least on the top end side.

Figure 5:
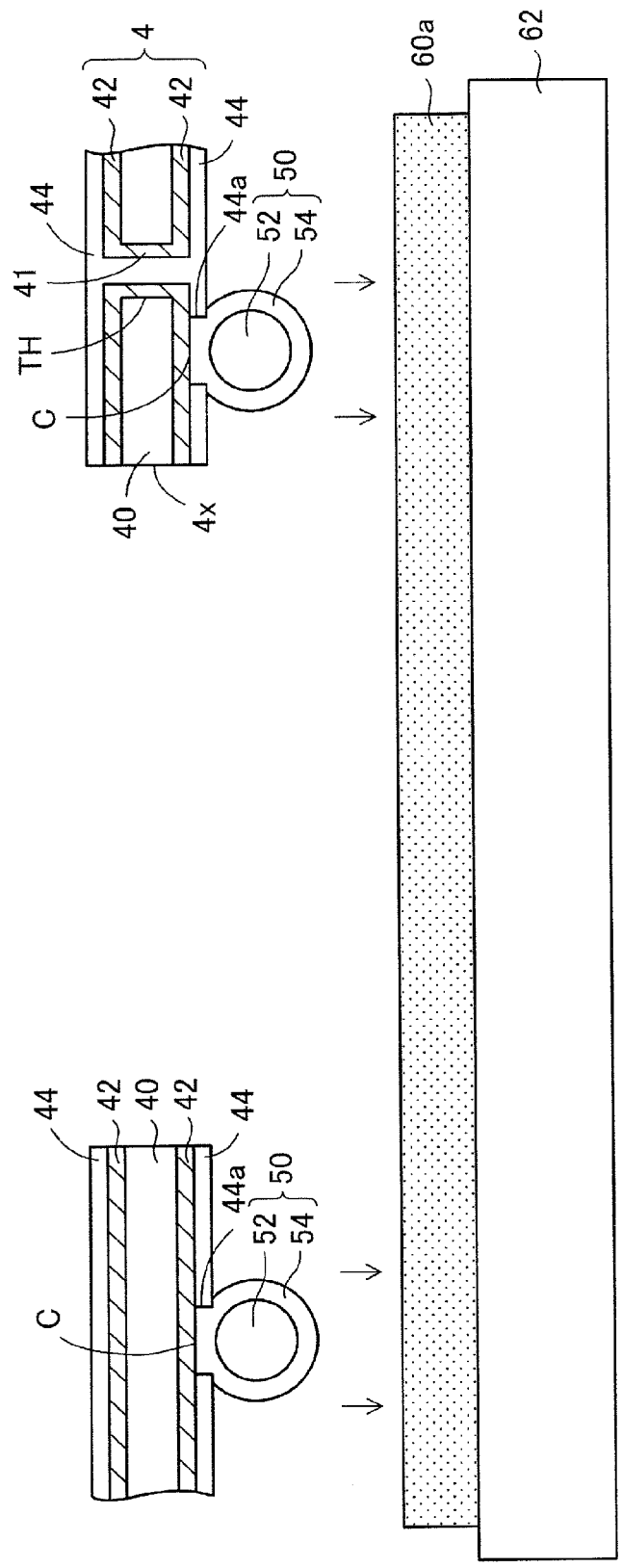
FIG. 5 is a sectional view (#5) depicting the method of manufacturing the electronic device according to the first embodiment.

Then, as depicted in FIG. 5, a transfer stage 62 in which a flux function containing resin 60a in an uncured state is coated on an upper surface, is prepared. The flux function containing resin 60a functions as the flux at the time of reflow heating, and after this resin is cured, it serves as the resin layer.

The flux function brings about such effects that the joining can be made easy by removing an oxide film generated on surfaces of the joined metals, and that wettability of the solder to surfaces of the joined metals can be promoted by decreasing a surface tension of the melting solder.

As an example of the flux function containing resin 60a, there is such a resin that an acid anhydride curing agent or carboxylic anhydride is added into an epoxy resin at a ratio of about 5% to 30%. Alternately, such a resin may be used that the rosin which is prepared from the pine resin is added into an epoxy resin.

Then, as also depicted in FIG. 5, the solder containing conductive balls 50 which are mounted on the lower surface of the second wiring substrate 4, are pushed against the flux function containing resin 60a on the transfer stage 62.

Figure 6:
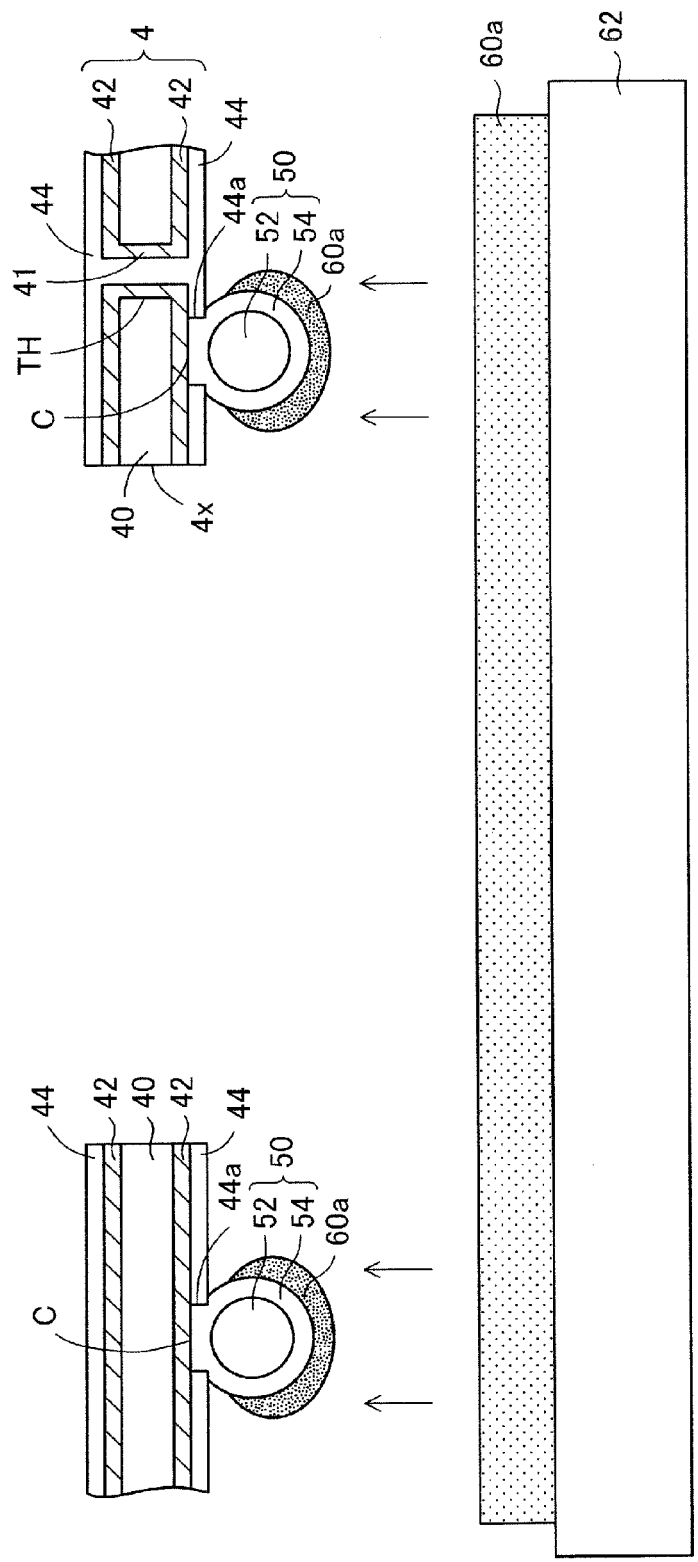
FIG. 6 is a sectional view (#6) depicting the method of manufacturing the electronic device according to the first embodiment.

Subsequently, as depicted in FIG. 6, the solder containing conductive balls 50 on the second wiring substrate 4 are pulled up from the flux function containing resin 60a on the transfer stage 62. Thus, the flux function containing resin 60a is transferred and adhered onto respective outer surfaces of the solder containing conductive balls 50.

In the case that the metal core ball 52 of the solder containing conductive balls 50 is set to 200 µm in diameter and the whole diameter including the solder layer 54 is set to 250 µm in diameter, a thickness of the flux function containing resin 60a formed on the transfer stage 62 is set to 100 µm to 150 µm. By setting respective sizes in this manner as an example, a sufficient amount of flux function containing resin 60a can be adhered onto respective outer surfaces of the solder containing conductive balls 50.

Figure 7:
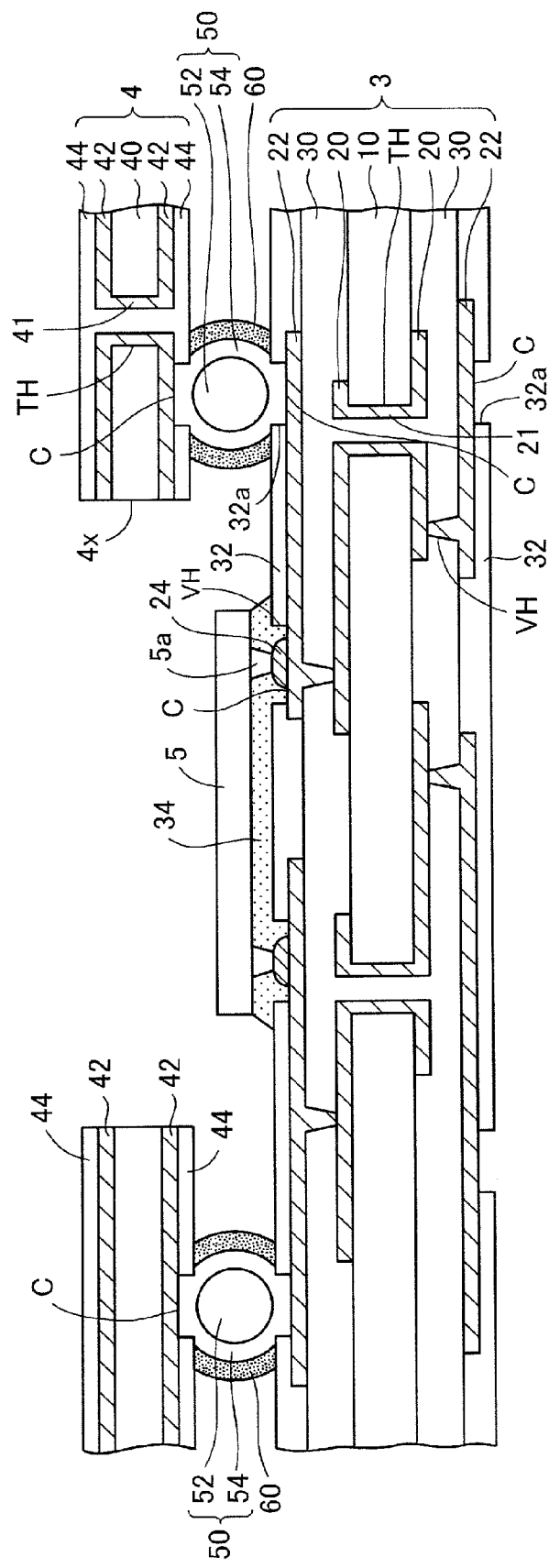
FIG. 7 is a sectional view (#7) depicting the method of manufacturing the electronic device according to the first embodiment.

Then, as depicted in FIG. 7, the solder containing conductive balls 50 of the second wiring substrate 4 are arranged on the connection portions C of the second wiring layers 22 of the first wiring substrate 3. Then, the solder layers 54 of the solder containing conductive balls 50 are melted by applying the reflow heating at a temperature of about 250° C.

By this matter, the solder containing conductive balls 50 of the second wiring substrate 4 are joined to the connection portions C of the second wiring layers 22 of the first wiring substrate 3, and are electrically connected to them. As a result, such a situation is obtained that the imaging element 5 mounted on the first wiring substrate 3 is arranged in the opening portion 4x of the second wiring substrate 4.

At this time, simultaneously, the flux function containing resin 60a adhered onto the solder containing conductive balls 50 of the second wiring substrate 4 functions as the flux at the time of reflow heating, and then is cured. That is, by the function of the flux function containing resin 60a, the oxide films on the connection portions C of the second wiring layers 22 on the first wiring substrate 3 can be removed, and also the wettability of the solder to the connection portions C can be promoted.

By this matter, the solder containing conductive balls 50 of the second wiring substrate 4 are joined to the connection portions C of the second wiring layers 22 of the first wiring substrate 3 with good reliability.

The flux function containing resins 60a functions as the fluxes upon applying the reflow soldering, as described above, and are formed and linked together between the solder containing conductive balls 50 arranged at a desired arrangement pitch, and thus is formed as a frame-like resin dam layer 60, as described later.

Figure 8:
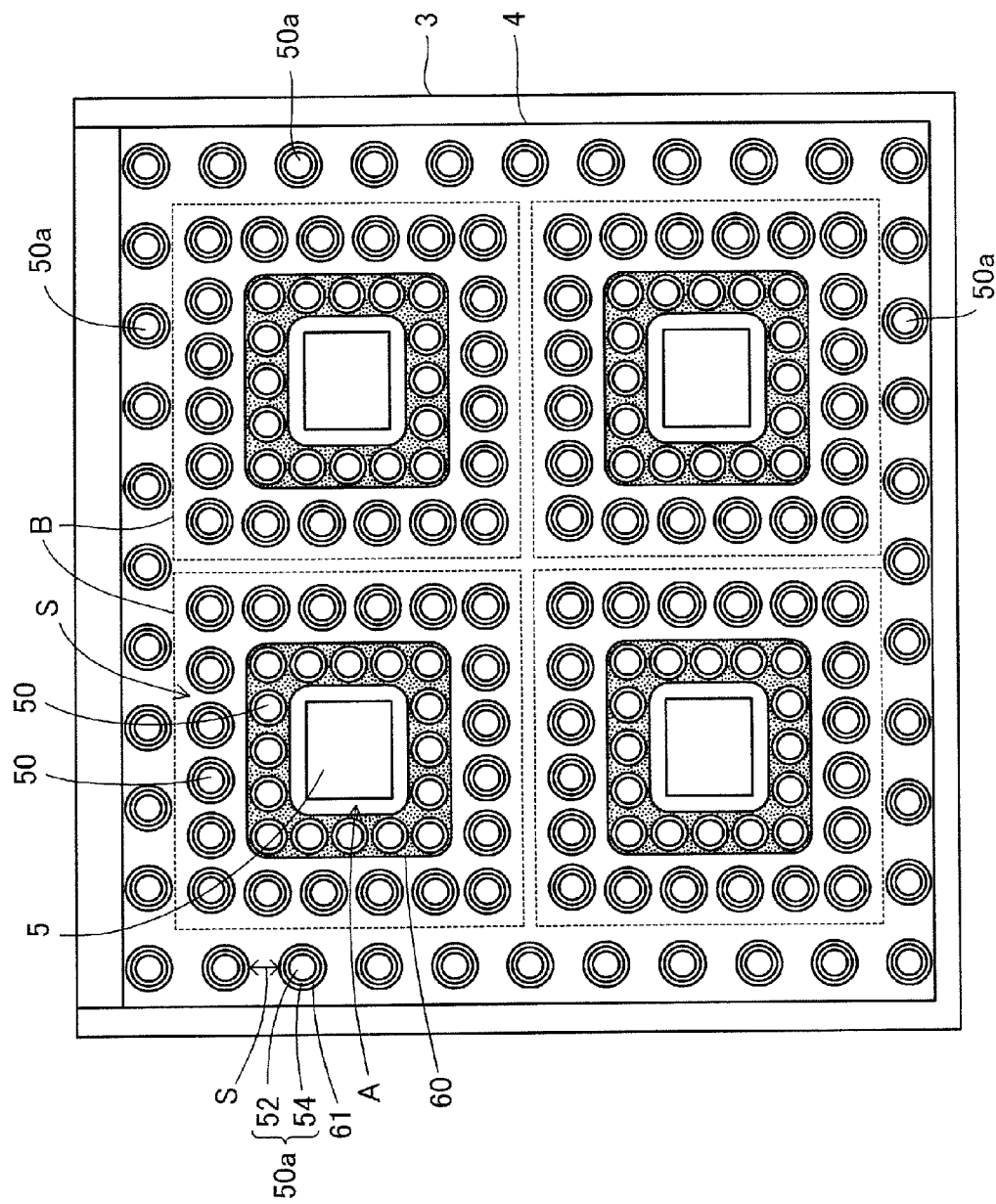
FIG. 8 is a plan view (#8) depicting the method of manufacturing the electronic device according to the first embodiment.
Figure 9:
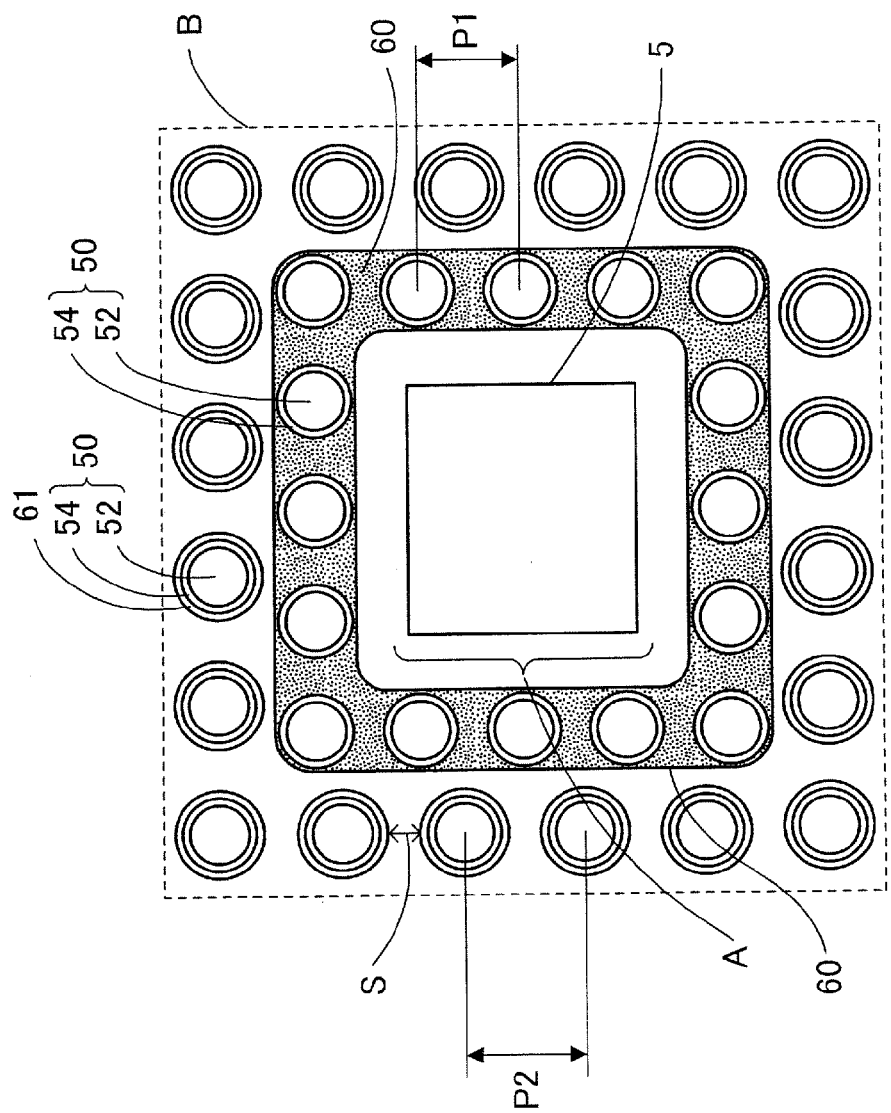
FIG. 9 is a plan view (#9) depicting the method of manufacturing the electronic device according to the first embodiment.

FIG. 8 is a plan view depicting the state that the solder containing conductive balls 50 of the second wiring substrate 4 are joined on the first wiring substrate 3 in a plan view of FIG. 3. Also, FIG. 9 is a fragmental plan view in which one package area B in FIG. 8 is depicted in an enlarged fashion. In FIG. 8 and FIG. 9, only the solder containing conductive balls 50 of the second wiring substrate 4 are depicted, and other elements are omitted herein.

As depicted in FIG. 8 and FIG. 9, in the present embodiment, in order to mount the imaging element 5 as the electronic device, when a sealing resin is filled between the first wiring substrate 3 and the second wiring substrate 4, it is needed that the sealing resin is not formed on the imaging element 5, and the imaging element 5 is exposed.

As depicted in FIG. 9, the solder containing conductive balls 50 of the second wiring substrate 4, which are arranged in the frame-like area that surrounds the component mounting area A, is set to 250 µm in the diameter, and an arrangement pitch P1 of the solder containing conductive balls 50 is set to 300 µm to 320 µm.

When setting the dimensions in such conditions as an example, the flux function containing resin 60a adhered onto a large number of solder containing conductive balls 50, which are arranged side by side on the periphery of the imaging element 5, is linked together between the solder containing conductive balls 50 at the time of reflow heating, and are formed as the resin dam layer 60. The resin dam layer 60 is formed like the frame to surround the component mounting area A in which the imaging element 5 is mounted.

As described later, the resin dam layer 60 is formed to block the sealing resin. Therefore, the sealing resin is not formed in the component mounting area A which is surrounded by the resin dam layer 60, and the component mounting area A is kept in an exposed state.

Meanwhile, as also depicted in FIG. 9, in the solder containing conductive balls 50 which are arranged on the peripheral part in the package area B of the first wiring substrate 3, an arrangement pitch P2 of them is set to about 400 µm or more. This arrangement pitch P2 is set wider than the arrangement pitch P1 of the solder containing conductive balls 50 which are arranged to surround the component mounting area A.

For this reason, with regard to the solder containing conductive balls 50 arranged on the peripheral part of the package area B on the first wiring substrate 3, simply a resin layer 61 is formed from the flux function containing resin 60a on respective outer surfaces of these conductive balls 50, and also a space S is still left between these solder containing conductive balls 50.

Also, as depicted in a plan view of FIG. 8, in order to stabilize the step when the first and second wiring substrates 3, 4 are stacked, dummy solder containing conductive balls 50a are arranged side by side on the outer edge parts from the package areas B on the first wiring substrate 3. Similarly, the resin layer 61 is also formed from the flux function containing resin 60a on the outer surfaces of these dummy solder containing conductive balls 50a, and also the space S is left between the dummy solder containing conductive balls 50a.

In this manner, in the example in FIG. 8, the frame-like resin dam layer 60 is formed on the periphery of the imaging devices 5, each of which is mounted in the component mounting area A of four package areas B of the first wiring substrate 3, respectively.

Here, in the above-mentioned mode, the resin dam layer 60 is formed by adhering the flux function containing resin 60a onto the solder containing conductive balls 50. Besides this method, after the flux is coated onto the solder containing conductive balls 50, a resin which does not contain the flux component is adhered onto the solder containing conductive balls 50, thus also the resin dam layer 60 can be formed.

Figure 10:
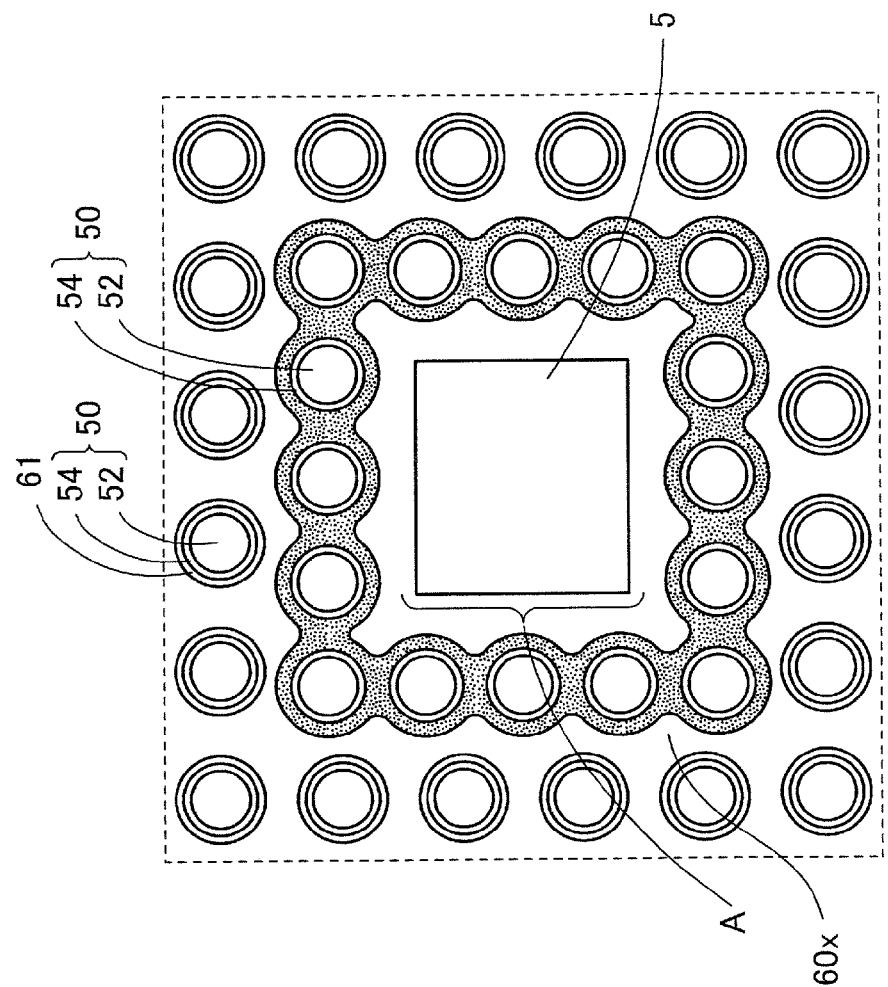
FIG. 10 is a plan view depicting a resin dam layer according to a variation of the first embodiment.

Also, like a resin dam layer 60x according to a variation depicted in FIG. 10, both side surfaces of the resin dam layer 60x may have a wavelike shape that is formed with the uneven along respective profiles of the solder containing conductive balls 50.

Then, as depicted in FIG. 11, a stacked body in which the second wiring substrate 4 is stacked on the first wiring substrate 3 is set on a mold (not shown), and then a sealing resin 64 is formed by filling a resin into a clearance between the first wiring substrate 3 and the second wiring substrate 4 from one end side.

The sealing resin 64 is filled through the spaces S (FIG. 9) between the solder containing conductive balls 50, etc. At this time, the imaging element 5 is surrounded by the resin dam layer 60. Therefore, even when the sealing resin flows into the component mounting areas A, such flow of the sealing resin is blocked by the resin dam layers 60. As a result, the sealing resin 64 is not formed on the imaging element 5 which is surrounded by the resin dam layer 60, and thus it is in a condition that the imaging elements 5 are exposed.

In this manner, the sealing resin 64 is filled in a clearance between the first wiring substrate 3 and the second wiring substrate 4 in such a manner that the component mounting areas A in which each of the imaging element 5 is mounted, are formed partly as the resin non-forming areas by the resin dam layer 60 respectively.

Here, the flux component contained in the fluxing function containing resin 60a hardens in the cured resin dam layer 60. Therefore, there is no need to carry out the step of cleaning the flux.

Also, in the above-mentioned mode, the flux function containing resin 60a is transferred and formed onto the solder containing conductive balls of the second wiring substrate 4. As another method, as depicted in FIG. 12, by discharging the flux function containing resin 60a from a nozzle 9 of a dispenser unit (not shown), the flux function containing resin 60a may be formed on the outer surfaces of the solder containing conductive balls 50 of the second wiring substrate 4.

In the case that the dispenser unit is employed, the flux function containing resin 60a can be coated onto the solder containing conductive balls 50 arranged on the periphery of the component mounting area A, to be linked like the belt. Hence, the resin dam layer 60 can be formed on the periphery of the component mounting area A with good precision not to produce a minute clearance between the solder containing conductive balls 50.

In contrast, with regard to the solder containing conductive balls 50 arranged on the peripheral parts of the package areas B, it is needed that the space S is ensured between them. Therefore, the flux function containing resin 60a is coated to every solder containing conductive ball 50 in a state that those conductive balls 50 are separated mutually by the dispenser unit.

Then, as depicted in FIG. 13, a resultant structure is cut from the upper surface of the second wiring substrate 4 to the lower surface of the first wiring substrate 3 so as to obtain individual package areas B of the stacked body in FIG. 11. At this time, in the example in FIG. 11, the area including the dummy solder containing conductive balls 50a located on the outside of the package areas B of the stacked body is abrogated.

Subsequently, a transparent glass cap 66 is provided on the second wiring substrate 4, and thus the opening portion 4x in the second wiring substrate 4 is covered with the transparent glass cap 66 to hermetically seal the imaging element 5.

Further, external connection terminals 26 are provided by mounting the solder ball on the connection portions C of the second wiring layers 22 on the lower surface side of the first wiring substrate 3, or the like.

The steps to provide the transparent glass cap 66 and the external connection terminals 26 may be performed before the stacked body in FIG. 11 is cut individually. Also, as the need arises, the transparent glass cap 66 may be omitted.

With the above, an electronic device 1 according to the first embodiment is obtained. The electronic device 1 of the first embodiment is manufactured as the imaging device having the imaging element 5.

As depicted in FIG. 13, in the electronic device 1 of the first embodiment, the gold bumps 5a of the imaging element 5 are connected to the connection portions C of the second wiring layers 22 in the component mounting area A of the first wiring substrate 3, explained in above FIG. 1, via the solder layers 24.

Figure 4:
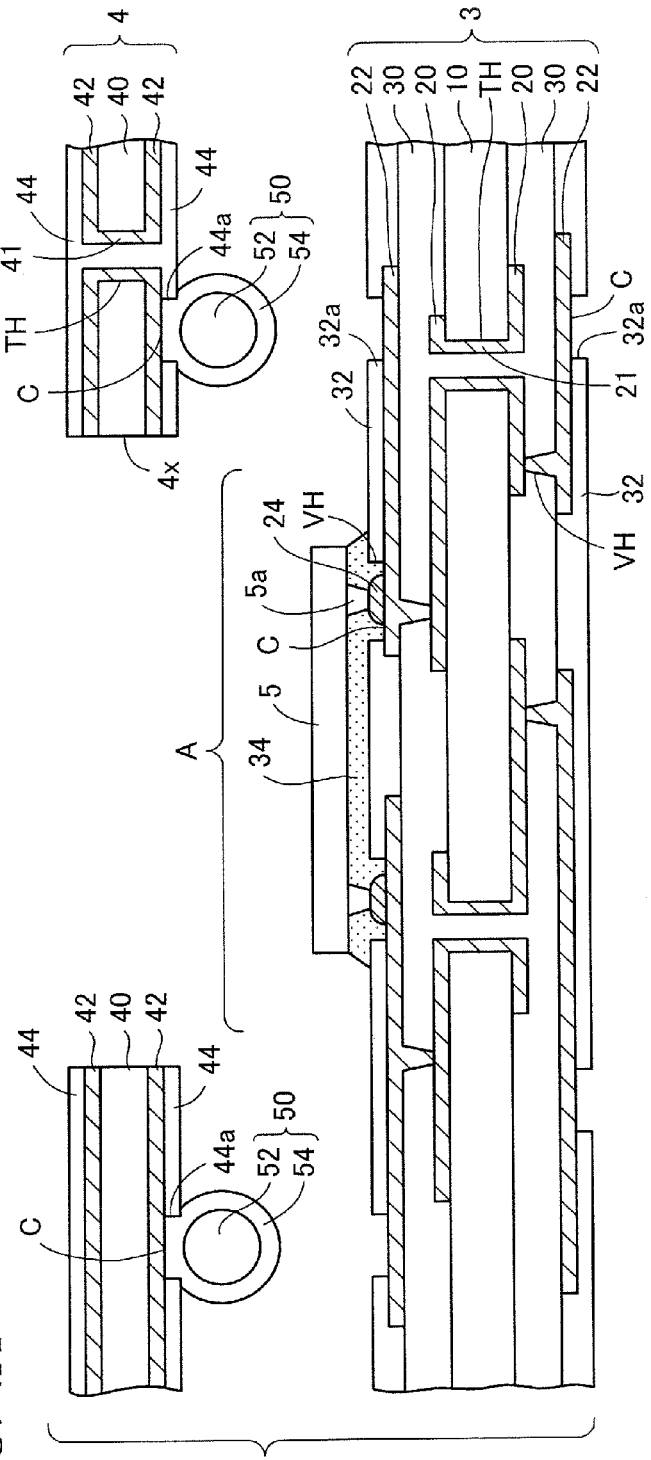
FIGS. 4A and 4B are sectional views (#4) depicting the method of manufacturing the electronic device according to the first embodiment.

Also, the second wiring substrate 4 explained in above FIG. 4 is stacked on the first wiring substrate 3 via the solder containing conductive balls 50. The opening portion 4x is provided in the area of the second wiring substrate 4, which corresponds to the component mounting area A in which the imaging element 5 is mounted. Then, the imaging element 5 is arranged in the opening portion 4x of the second wiring substrate 4.

By reference to above FIG. 11 together, the second wiring substrate 4 includes the solder containing conductive balls 50, which are arranged side by side in the parts corresponding to the frame-like areas on the periphery of the component mounting area A in which the imaging element 5 is mounted. Then, the solder containing conductive balls 50 of the second wiring substrate 4 are connected to the connection portions C of the second wiring layers 22 of the first wiring substrate 3.

Also, the resin dam layer 60 is formed and linked together between the solder containing conductive balls 50, which are arranged on the periphery of the component mounting areas A. Thus, each of the component mounting areas A is surrounded by the frame-like resin dam layer 60.

As described above, the resin dam layer 60 is formed in such a manner that the flux function containing resins 60a adhered onto a large number of solder containing conductive balls 50 are formed and linked together between the solder containing conductive balls 50 at the time of reflow heating.

Also, with regard to the solder containing conductive balls 50 arranged in the periphery part of the package areas B, the resin layer 61 formed from the flux function containing resins 60a is covered on respective outer surfaces. Thus, it is in a condition that respective solder containing conductive balls 50 are separated mutually.

Further, the sealing resin 64 is filled in a clearance between the first wiring substrate 3 and the second wiring substrate 4. The sealing resin 64 is blocked by the resin dam layers 60, and the component mounting areas A in which the imaging element 5 is mounted respectively are formed as the resin non-forming areas.

Moreover, the transparent glass cap 66 is provided on the second wiring substrate 4, and thus the imaging element 5 is hermetically sealed in the opening portion 4x of the second wiring substrate 4.

In the electronic device 1 of the present embodiment, the frame-like resin dam layer 60 is formed on the periphery of the component mounting area A. Therefore, the sealing resin 64 is blocked by the resin dam layers 60, and thus the component mounting areas A are formed as the resin non-forming areas.

The resin dam layer 60 is formed such a manner that the flux function containing resins 60a adhered onto a large number of solder containing conductive balls 50 which surround the component mounting areas A are formed and linked together at the time of reflow heating.

Accordingly, the solder containing conductive balls 50 of the second wiring substrate 4 can be connected to the first wiring substrate 3 by the flux function with good reliability, and simultaneously the resin dam layer 60 can be formed and linked together in the frame-like areas in which the solder containing conductive balls 50 are arranged at a predetermined arrangement pitch.

In this manner, in the first embodiment, when the sealing resin 64 is filled into a clearance between the first wiring substrate 3 and the second wiring substrate 4, respective areas on which the sealing resin 64 is not formed and is kept in its exposed state can be formed easily in the partial areas on the first wiring substrate 3.

Here, in the above mode, the imaging device is manufactured as the electronic device, by mounting the imaging element 5 in advance on the component mounting areas A of the first wiring substrate 3. In addition to this mode, the stacked type wiring substrate may be manufactured in such a manner that the electronic component is not mounted in the component mounting area A of the first wiring substrate 3 during the manufacturing steps and the component mounting areas A are formed as the resin non-forming areas. Then, various electronic components can be mounted on the component mounting areas A of the first wiring substrate 3 in a state that electronic component is exposed.

(Second Embodiment)

Figure 19:
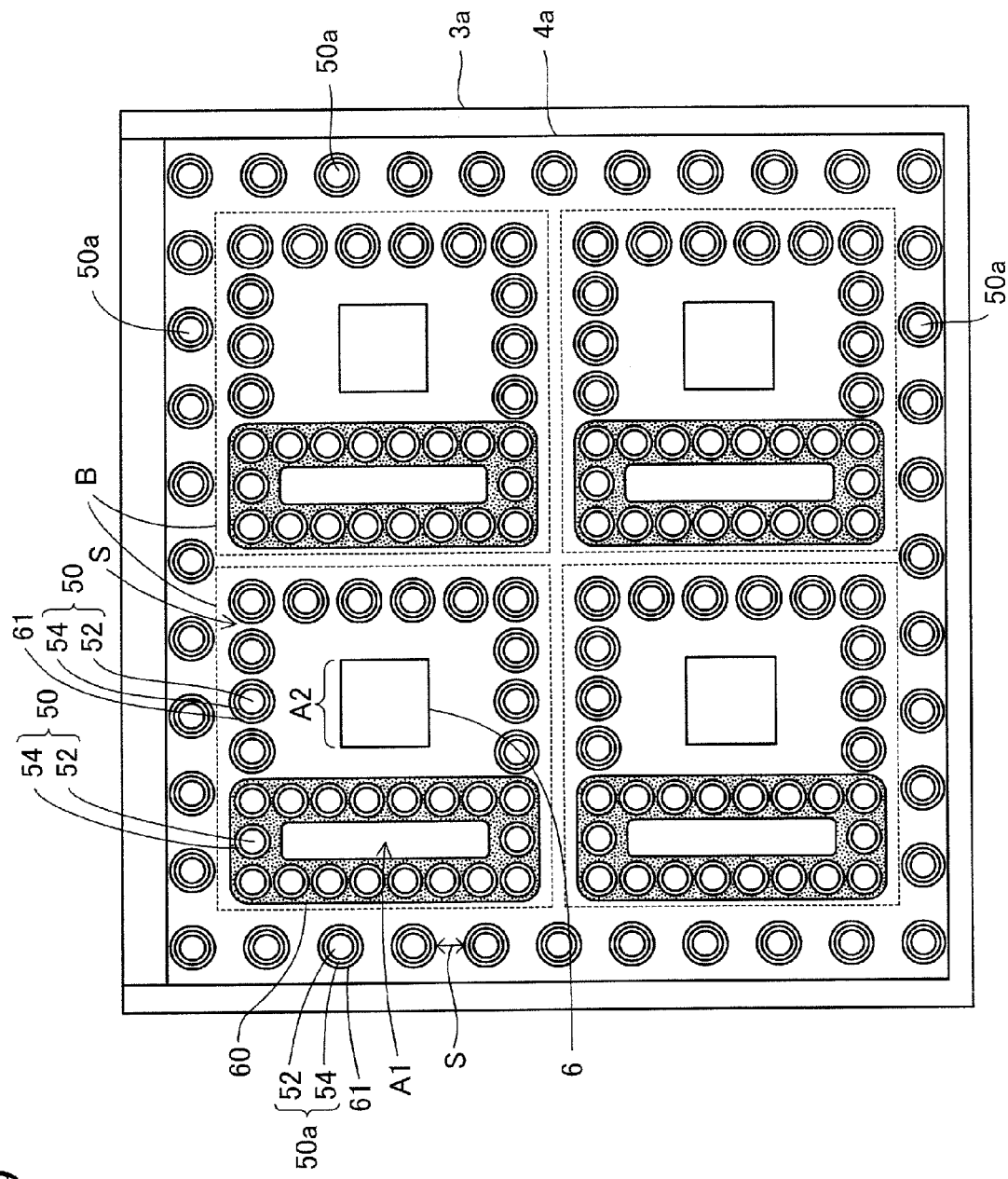
FIG. 19 is a plan view (#6) depicting the method of manufacturing the electronic device according to the second embodiment.
Figure 20:
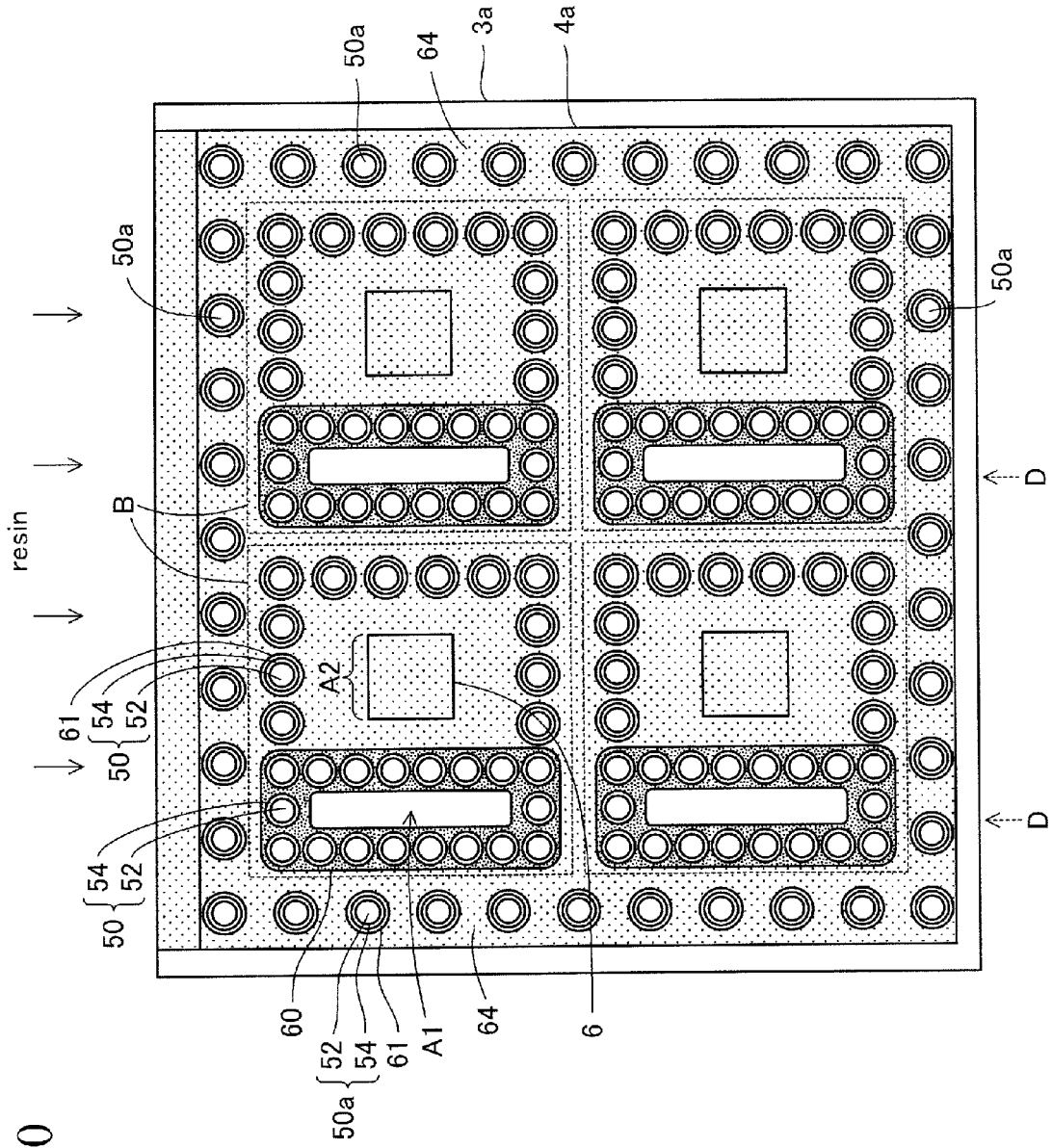
FIG. 20 is a plan view (#7) depicting the method of manufacturing the electronic device according to the second embodiment.
Figure 21:
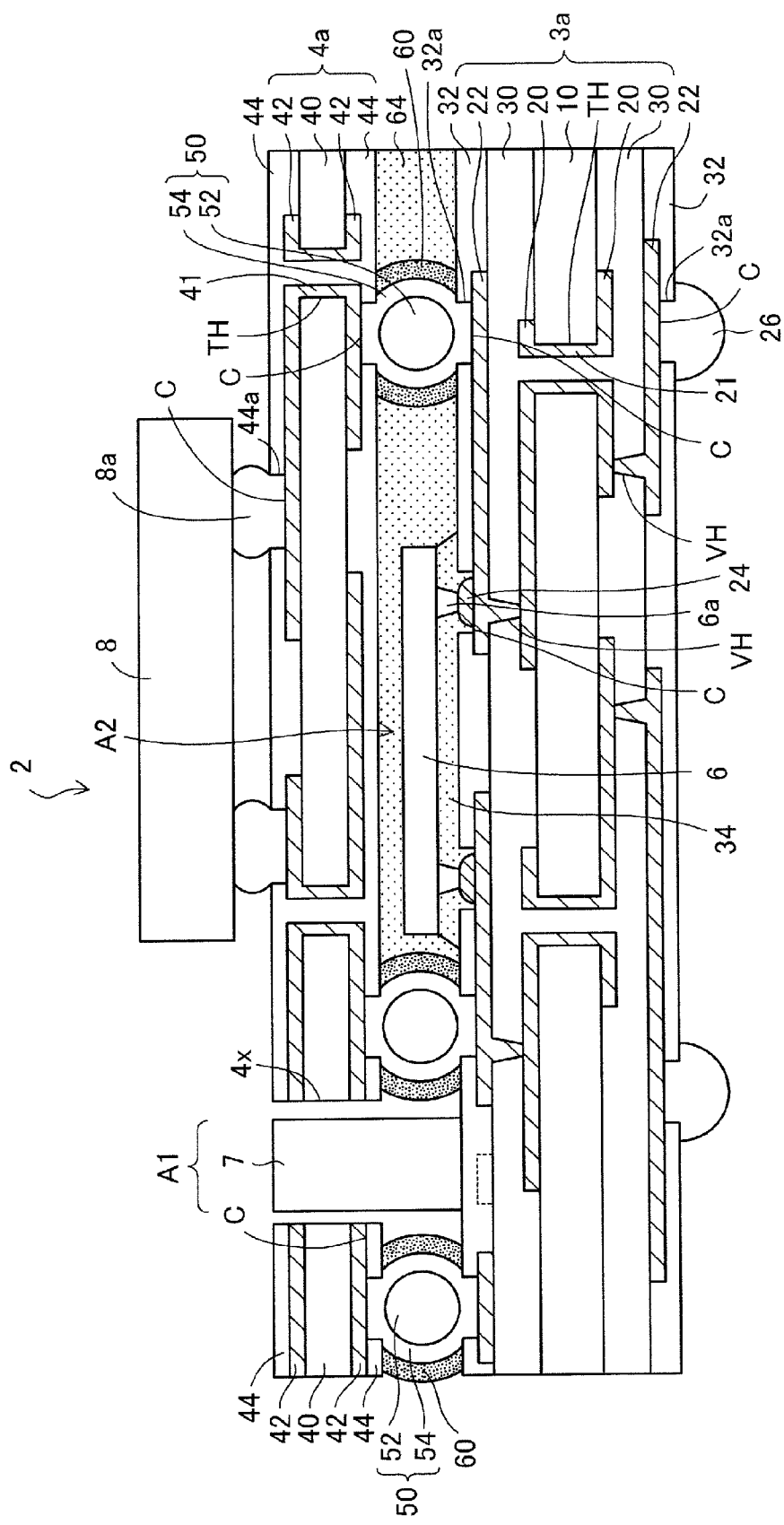
FIG. 21 is a sectional view depicting an electronic device according to the second embodiment.

FIG. 14 to FIG. 20 are views depicting a method of manufacturing an electronic device according to a second embodiment, and FIG. 21 is a view depicting an electronic device according to the second embodiment.

Figure 14:
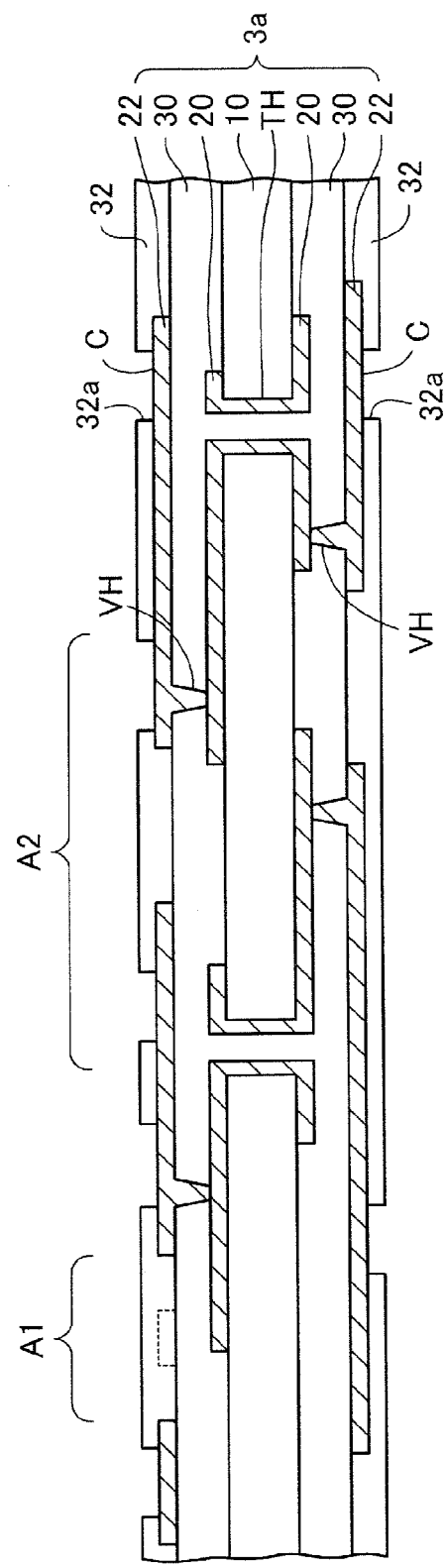
FIG. 14 is a sectional view (#1) depicting a method of manufacturing an electronic device according to a second embodiment.

In the method of manufacturing the electronic device of the second embodiment, as depicted in FIG. 14, first, a first wiring substrate 3a which is similar to the first wiring substrate 3 in FIG. 1 of the first embodiment is prepared.

A difference of the first wiring substrate 3a of the second embodiment from the first wiring substrate 3 of the first embodiment resides in that, besides a first component mounting area A1 used as the resin non-forming area, a second component mounting area A2 in which a semiconductor chip is mounted and on which the sealing resin is formed is provided.

In the second embodiment, the first component mounting area A1 of the first wiring substrate 3a is surrounded by the resin dam layer, and thus the first component mounting area A1 is formed as the resin non-forming area.

Since other elements of the first wiring substrate 3a in FIG. 14 are substantially identical to those of the first wiring substrate 3 of the first embodiment, their explanation will be omitted hereunder by affixing the same reference symbols to them.

Figure 15:
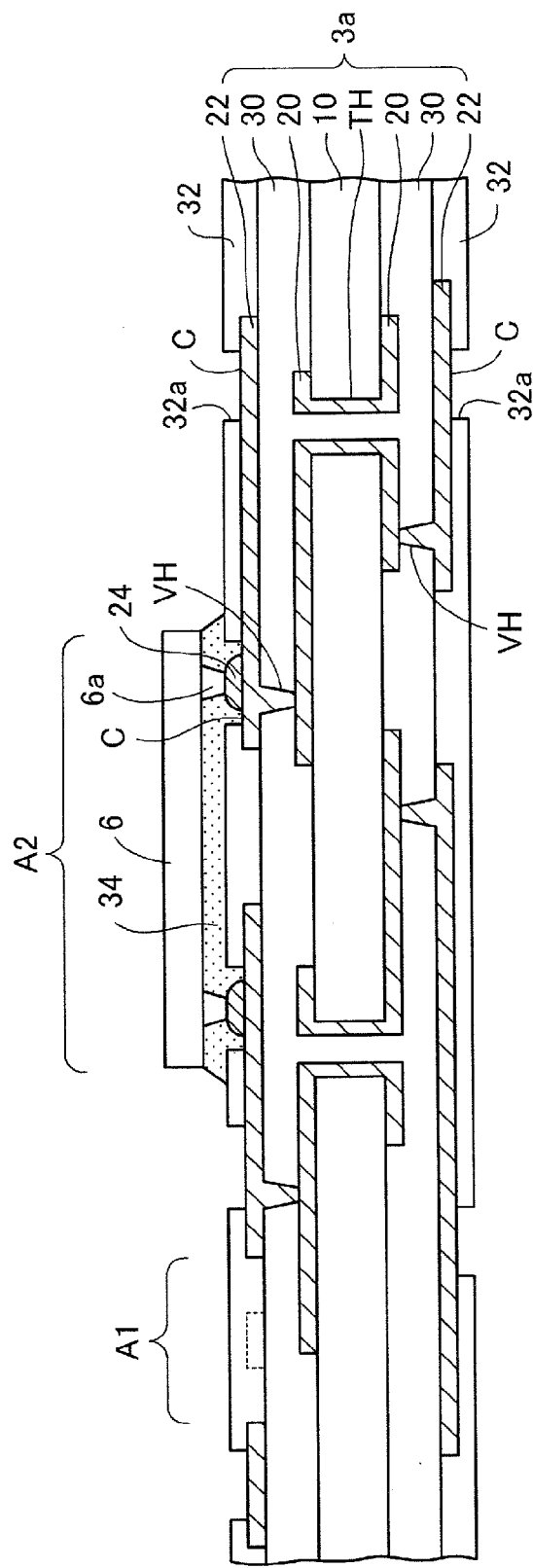
FIG. 15 is a sectional view (#2) depicting the method of manufacturing the electronic device according to the second embodiment.

Then, as depicted in FIG. 15, a semiconductor chip 6 having gold bumps 6a is prepared. Then, the gold bumps 6a of the semiconductor chip 6 are flip-chip connected to the connection portions C of the second wiring layers 22 of the first wiring substrate 3a via the solder layers 24.

Figure 16:
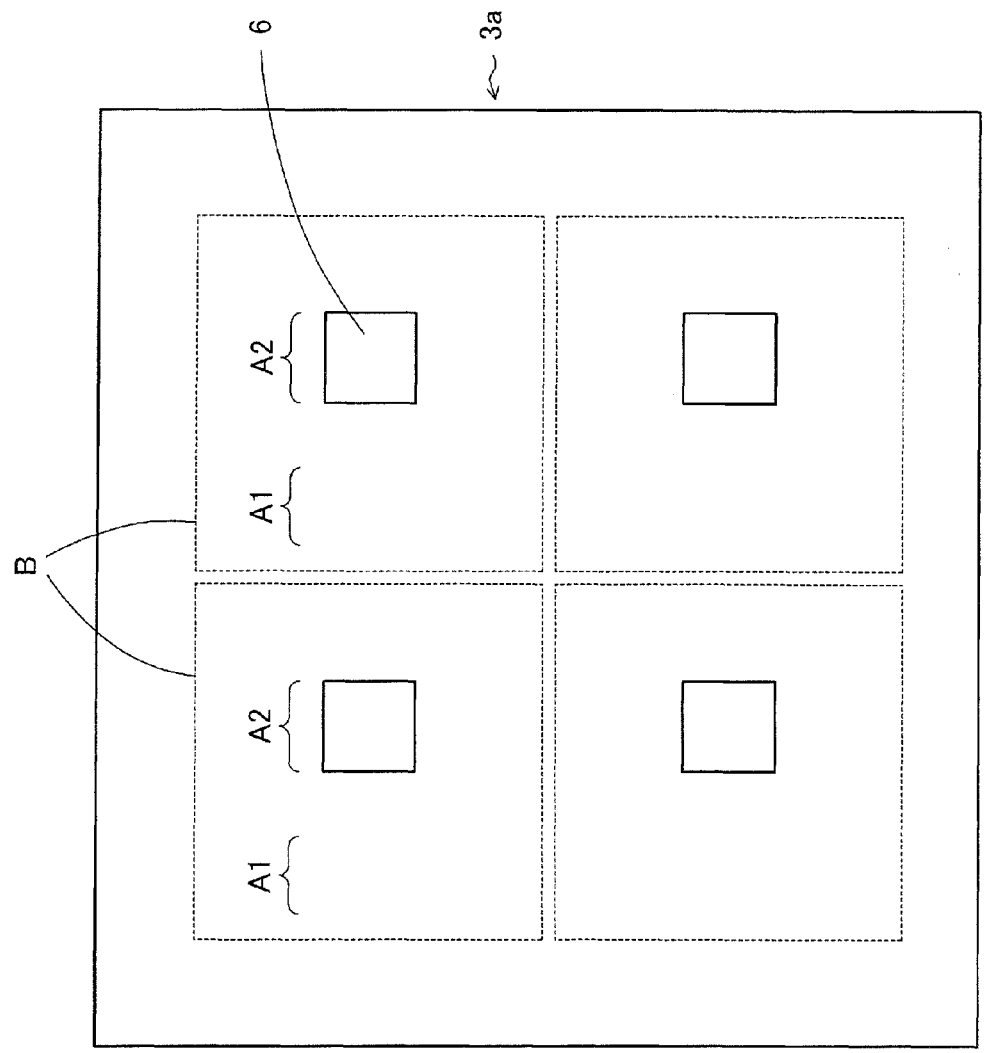
FIG. 16 is a plan view (#3) depicting the method of manufacturing the electronic device according to the second embodiment.

As depicted in a plan view in FIG. 16, in the second embodiment, the first wiring substrate 3a serves as the multi production substrate, and four package areas B are demarcated as an example. Then, the semiconductor chip 6 is mounted on the second component mounting areas A2 of the package areas B of the first wiring substrate 3a respectively. As the semiconductor chip 6, CPU, system LSI, or the like, for example, is used.

Figure 17:
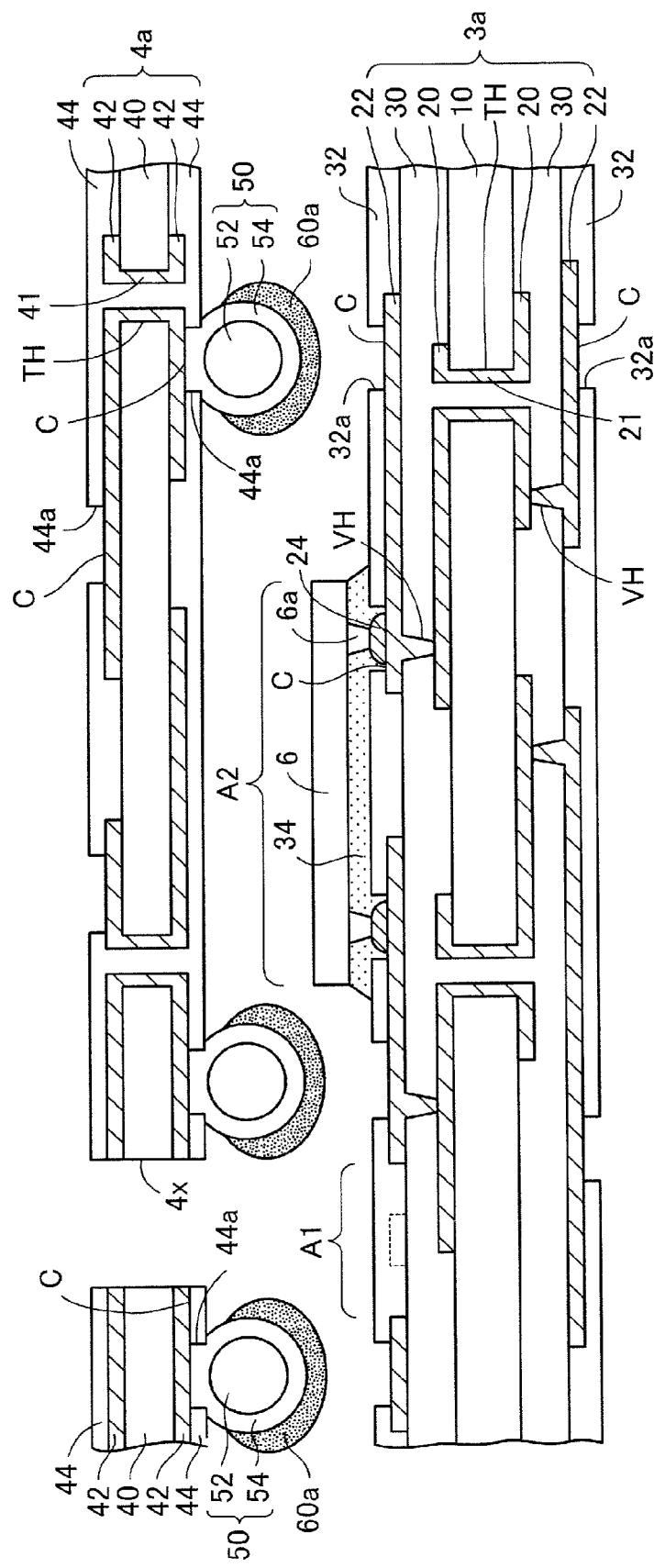
FIG. 17 is a sectional views (#4) depicting the method of manufacturing the electronic device according to the second embodiment.

Subsequently, as depicted in FIG. 17, a second wiring substrate 4a is prepared. In the second wiring substrate 4a of the second embodiment, the opening portion 4x is provided in the parts corresponding to the first component mounting areas A1 of the first wiring substrate 3a. Then, like the first embodiment, the solder containing conductive balls 50 are mounted on the connection portions C of the wiring layers 42 on the lower surface side of the second wiring substrate 4a.

Also, in the solder resist 44 on the upper surface side of the core substrate 40, the opening portion 44a is provided on the connection portions C of the wiring layers 42.

Since other elements of the second wiring substrate 4a in FIG. 17 are substantially identical to those of the second wiring substrate 4 of the first embodiment, the same reference symbols are affixed to them and their explanation will be omitted hereunder.

Further, as also depicted in FIG. 17, according to the similar method to those in FIG. 5 and FIG. 6 of the first embodiment, the flux function containing resin 60a is adhered onto the outer surfaces of the solder containing conductive balls 50 of the second wiring substrate 4a by using the transfer method. Otherwise, as explained in FIG. 12 of the first embodiment, the flux function containing resin 60a may be coated to the solder containing conductive balls 50 by using the dispenser unit.

Figure 18:
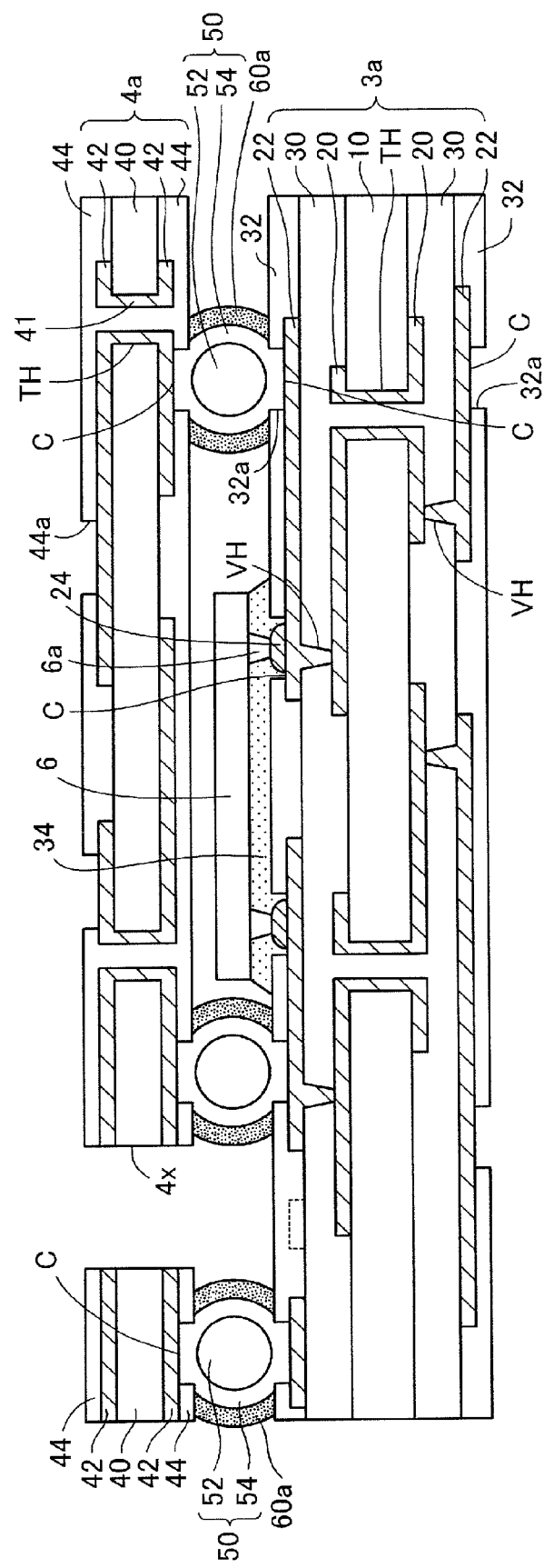
FIG. 18 is a sectional view (#5) depicting the method of manufacturing the electronic device according to the second embodiment.

Then, as depicted in FIG. 18, like the first embodiment, the solder containing conductive balls 50 of the second wiring substrate 4a are arranged on the connection portions C of the second wiring layers 22 of the first wiring substrate 3a, and then the reflow heating is applied to this structure. By this matter, the solder containing conductive balls 50 of the second wiring substrate 4a are joined to the connection portions C of the second wiring layers 22 of the first wiring substrate 3a, and are connected electrically to them.

At this time, by reference to a plan view of FIG. 19 together, an arrangement pitch of the solder containing conductive balls 50 arranged on the periphery of the first component mounting area A1 of the first wiring substrate 3a, is set to a narrower pitch to such an extend that the flux function containing resin 60a can be linked together to produce the resin dam layer 60, like the first embodiment.

By this matter, like the first embodiment, the resin dam layer 60 is formed and linked together like the frame shape, from the flux function containing resins 60a, between the solder containing conductive balls 50 arranged on the periphery of the first component mounting area A1 of the first wiring substrate 3a.

In contrast, both arrangement pitches of the solder containing conductive balls 50 arranged in other areas in the package areas B, and the dummy solder containing conductive balls 50a arranged in the outer edge parts, are set widely. Therefore, only the resin layer 61 is formed on the outer surfaces of these solder containing conductive balls 50, 50a, and thus the space S is still left between the solder containing conductive balls 50, 50a.

In this manner, as depicted in FIG. 18 and FIG. 19, the frame-like resin dam layer 60 is arranged so as to surround the first component mounting areas A1 of the first wiring substrate 3a, so that the first component mounting area A1 is arranged in the opening portions 4x of the second wiring substrate 4a.

Then, as depicted in FIG. 20, like the first embodiment, a stacked body in which the second wiring substrate 4a is stacked on the first wiring substrate 3a is set on a mold (not shown). Then, a resin is filled into clearance between the first wiring substrate 3a and the second wiring substrate 4a from one end side, and the sealing resin 64 is formed.

In the second embodiment, the first component mounting areas A1 of the first wiring substrate 3a are surrounded by the resin dam layer 60. Therefore, even when the resin flows into the first component mounting areas A1, such flow of the resin is blocked by the resin dam layers 60. By this matter, the sealing resin 64 is not formed in the first component mounting areas A1 which are surrounded by the resin dam layer 60, and it is in a condition the first component mounting areas A1 are exposed.

Meanwhile, the semiconductor chip 6 arranged in respective second component mounting areas A2 is sealed with the sealing resin 64.

Then, as depicted in FIG. 21, the stacked body in FIG. 20 is cut from the upper surface of the second wiring substrate 4a to the lower surface of the first wiring substrate 3a so as to obtain respective package areas B. Then, an electronic component 7 is connected to the second wiring layers 22 and is mounted in the first component mounting area A1 of the first wiring substrate 3a.

As the electronic component 7 mounted in the first component mounting area A1, a passive element component such as a tall stature capacitor component, etc., a light receiving element component, or the like is mounted.

Also, bump electrodes 8a of a memory device 8 are connected to the connection portions C of the wiring layers 42 on the upper surface side of the second wiring substrate 4a. Then, the external connection terminals 26 are provided by mounting a solder ball, or the like, on the connection portions C of the second wiring layers 22 on the lower surface side of the first wiring substrate 3a.

Respective steps to provide the electronic component 7, the memory device 8, and the external connection terminals 26 may be performed before the stacked body in FIG. 20 is cut individually.

With the above, an electronic device 2 according to the second embodiment is obtained. The electronic device 2 of the second embodiment is manufactured as the semiconductor device.

As depicted in FIG. 21, in the electronic device 2 of the second embodiment, the gold bumps 6a of the semiconductor chip 6 are connected to the connection portions C of the second wiring layers 22 in the second component mounting area A2 of the first wiring substrate 3a, explained in above FIG. 14, via the solder layers 24.

Also, the second wiring substrate 4a, explained in above FIG. 17, is stacked on the first wiring substrate 3a via the solder containing conductive balls 50. In the second wiring substrate 4a, the opening portion 4x is provided in the part corresponding to the first component mounting area A1 of the first wiring substrate 3a, in which the electronic component 7 is mounted. Also, the electronic component 7 is arranged in the opening portion 4x of the second wiring substrate 4a.

By reference to a plan view of above FIG. 20 together, the second wiring substrate 4a includes the solder containing conductive balls 50 which are arranged side by side in the part corresponding to the frame-like area on the periphery of the first component mounting area A1 in which the electronic component 7 is mounted.

Then, these solder containing conductive balls 50 of the second wiring substrate 4a are connected to the connection portions C of the second wiring layers 22 of the first wiring substrate 3a.

Also, the resin dam layer 60 is formed and linked together between the solder containing conductive balls 50 which are arranged side by side on the periphery of the first component mounting areas A1, and also the first component mounting areas A1 are surrounded by the frame-like resin dam layer 60. Like the first embodiment, the resin dam layer 60 is formed such a manner that the flux function containing resins 60a adhered onto respective solder containing conductive balls 50 are formed and linked together between the solder containing conductive balls 50 at the time of reflow heating.

Further, the sealing resin 64 is filled into a clearance between the first wiring substrate 3a and the second wiring substrate 4a, and thus the semiconductor chips 6 mounted in the second component mounting areas A2 of the first wiring substrate 3a are sealed with the sealing resin 64. The sealing resin 64 is blocked by the resin dam layers 60, thus the first component mounting areas A1 in which the electronic component 7 is mounted are formed as the resin non-forming areas.

Also, the bump electrodes 8a of the memory device 8 are connected to the connection portions C of the wiring layers 42 of the second wiring substrate 4a.

In the electronic device 2 of the second embodiment, like the first embodiment, the frame-like resin dam layer 60 is formed on the periphery of the first component mounting areas A1. Therefore, the sealing resin 64 is blocked by the resin dam layers 60, and thus the first component mounting areas A1 in which the electronic component 7 is mounted respectively are formed as the resin non-forming areas.

In this manner, also in the second embodiment, when the sealing resin 64 is filled into a clearance between the first wiring substrate 3a and the second wiring substrate 4a, the areas in which the sealing resin 64 is not formed and which is still kept in their exposed state can be easily formed on the partial areas on the first wiring substrate 3a.

In this event, in FIG. 21, the stacked body in FIG. 20 is cut along the package areas B which are surrounded by a broken line. Besides it, for example, a group of the solder containing conductive balls 50 arranged in one row on the left side, out of the solder containing conductive balls 50 which are provided to surround the first component mounting area A1, may be formed as the dummy balls, and the stacked body in FIG. 20 may be cut off along lines indicated with D in FIG. 20.

Figure 22:
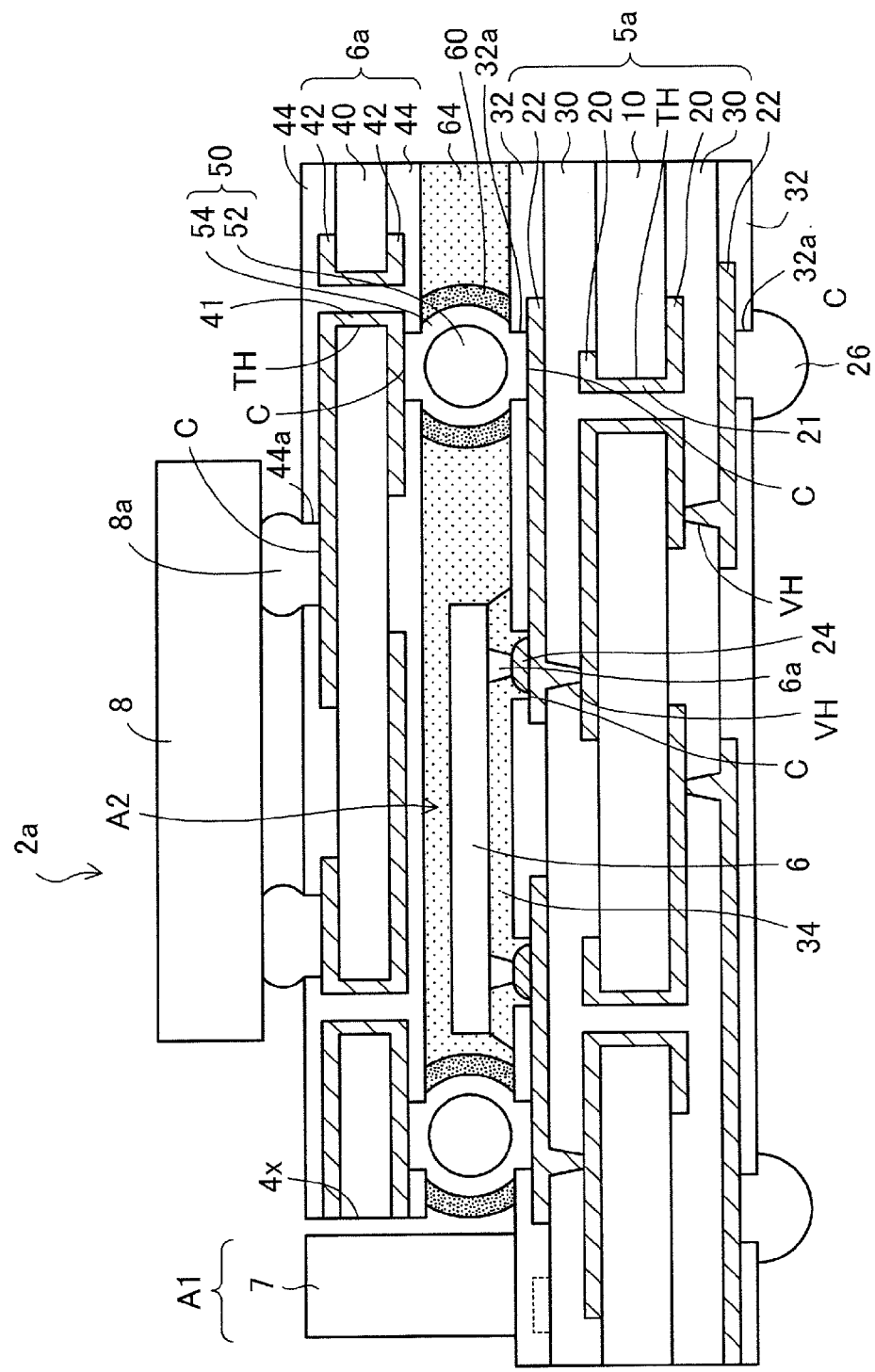
FIG. 22 is a sectional view depicting an electronic device according to a variation of the second embodiment.

In this case, as depicted in an electronic device 2a according to a variation of FIG. 22, the first component mounting area A1 formed as the resin non-forming area can be obtained in a state that its outside lateral direction is opened. In the electronic device 2a of the variation, the outside lateral direction of the first component mounting area A1 is opened, therefore it facilitates the mounting of the electronic component 7.

Also, in the case that the light receiving element component is used as the electronic component 7 which is mounted in the first component mounting area A1, the light receiving element component can receive the light from the lateral direction as well.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a first wiring substrate including a component mounting area;
   a second wiring substrate stacked on the first wiring substrate, in which an opening portion penetrating from an upper face of the second wiring substrate to a lower face is provided in a part corresponding to the component mounting area;
   a plurality of solder bumps which are arranged to have an interval on a periphery of the component mounting area so as to surround the component mounting area, and connect the first wiring substrate and the second wiring substrate;
   a frame-like resin dam layer formed between the solder bumps on the periphery of the component mounting area, and surrounding the component mounting area; and
   an electronic component mounted on the component mounting area of the first wiring substrate; and
   a sealing resin filled in an area between the first wiring substrate and the second wiring substrate, the area located to an outside of the frame-like resin dam layer, wherein the component mounting area located to an inside of the frame-like resin dam layer is formed as a resin non-forming area in which no sealing resin exists.

2. An electronic device according to claim 1, wherein the electronic component is an imaging element.

3. An electronic device according to claim 1, wherein the electronic component is a passive element component or a light receiving element component; and further comprising: a semiconductor chip mounted on the first wiring substrate on an outside of the frame-like resin dam layer, and sealed with the sealing resin.

4. An electronic device according to claim 1, wherein the resin dam layer is formed of a resin having a flux function.

5. An electronic device according to claim 1, wherein each of the solder bumps is formed of a metal core solder ball in which an outer surface of a metal core ball is covered with a solder layer, a resin core solder ball in which an outer surface of a resin core ball is covered with a solder layer, or a metal post in which at least a part in a location connected to the first wiring substrate is covered with a solder layer.

* * * * *